(12) United States Patent
Burak et al.

(10) Patent No.: US 9,571,064 B2
(45) Date of Patent: Feb. 14, 2017

(54) ACOUSTIC RESONATOR DEVICE WITH AT LEAST ONE AIR-RING AND FRAME

(71) Applicant: Avago Technologies Wireless IP (Singapore) Pte. Ltd., Singapore (SG)

(72) Inventors: Dariusz Burak, Fort Collins, CO (US); Phil Nikkel, Loveland, CO (US); Alexandre Augusto Shirakawa, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 201 days.

(21) Appl. No.: 14/192,599

(22) Filed: Feb. 27, 2014

(65) Prior Publication Data
US 2014/0176261 A1    Jun. 26, 2014

Related U.S. Application Data

(63) Continuation-in-part of application No. 13/151,631, filed on Jun. 2, 2011, now Pat. No. 9,203,374, which is
(Continued)

(51) Int. Cl.
*H03H 9/15*    (2006.01)
*H03H 9/17*    (2006.01)
(Continued)

(52) U.S. Cl.
CPC ......... *H03H 9/173* (2013.01); *H03H 9/02086* (2013.01); *H03H 9/02118* (2013.01);
(Continued)

(58) Field of Classification Search
CPC .............. H03H 9/02086; H03H 9/0211; H03H 9/02118; H03H 9/132; H03H 9/173; H03H 9/54; H03H 9/564; H03H 9/582; H03H 9/587; H03H 9/02007; H03H 3/04
(Continued)

(56) References Cited

U.S. PATENT DOCUMENTS 5,587,620 A    12/1996 Ruby et al.
5,873,153 A    2/1999 Ruby et al.
(Continued)

FOREIGN PATENT DOCUMENTS

CN    1171382    10/2004
JP    2000-514278    10/2000
(Continued)

OTHER PUBLICATIONS

Yang et al.; "Spurious Wave Suppression in BAW Resonators with Frame-like Airgap"; 2010 IEEE International Frequency Control Symposium (FCS); Jun. 1-4, 2010, pp. 656-660, and 1 page IEEE Xplore Abstract.*
(Continued)

*Primary Examiner* — Barbara Summons

(57) ABSTRACT

An acoustic resonator device includes a bottom electrode disposed on a substrate over an air cavity, a piezoelectric layer disposed on the bottom electrode, and a top electrode disposed on the piezoelectric layer, where an overlap between the top electrode, the piezoelectric layer and the bottom electrode over the air cavity defines a main membrane region. The acoustic resonator device further includes at least one air-ring defining a boundary of the main membrane region, and at least one first frame formed between the bottom electrode and the piezoelectric layer or formed between the substrate and the bottom electrode, and a second frame formed between the piezoelectric layer and the top electrode.

20 Claims, 20 Drawing Sheets

Related U.S. Application Data a continuation-in-part of application No. 13/074,262, filed on Mar. 29, 2011, now Pat. No. 9,136,818, which is a continuation-in-part of application No. 13/036,489, filed on Feb. 28, 2011, now Pat. No. 9,154,112, application No. 14/192,599, which is a continuation-in-part of application No. 13/660,941, filed on Oct. 25, 2012, now Pat. No. 9,425,764.

(51) Int. Cl.
*H03H 9/54* (2006.01)
*H03H 9/02* (2006.01)
*H03H 9/13* (2006.01)
*H03H 3/04* (2006.01)

(52) U.S. Cl.
CPC .............. *H03H 9/132* (2013.01); *H03H 9/54* (2013.01); *H03H 3/04* (2013.01); *H03H 9/02007* (2013.01)

(58) Field of Classification Search
USPC .................................................. 333/187, 189
See application file for complete search history.

(56) References Cited

U.S. PATENT DOCUMENTS

| | | | |
|---|---|---|---|
| 6,107,721 A | 8/2000 | Lakin | |
| 6,291,931 B1 | 9/2001 | Lakin | |
| 6,384,697 B1 | 5/2002 | Ruby et al. | |
| 6,396,200 B2 | 5/2002 | Misu et al. | |
| 6,507,983 B1 | 1/2003 | Ruby et al. | |
| 6,548,943 B2 | 4/2003 | Kaitila et al. | |
| 6,617,751 B2 | 9/2003 | Sunwoo et al. | |
| 6,864,619 B2 | 3/2005 | Aigner et al. | |
| 6,936,837 B2 | 8/2005 | Yamada et al. | |
| 7,129,806 B2 | 10/2006 | Sato | |
| 7,233,218 B2 | 6/2007 | Park et al. | |
| 7,275,292 B2 | 10/2007 | Ruby et al. | |
| 7,280,007 B2 | 10/2007 | Feng et al. | |
| 7,345,410 B2 | 3/2008 | Grannen et al. | |
| 7,358,831 B2 | 4/2008 | Larson, III et al. | |
| 7,369,013 B2 * | 5/2008 | Fazzio ............... | H03H 9/02149 310/312 |
| 7,388,454 B2 | 6/2008 | Ruby et al. | |
| 7,468,608 B2 | 12/2008 | Feucht et al. | |
| 7,541,717 B2 * | 6/2009 | Schmidhammer . | H03H 9/02118 310/320 |
| 7,602,102 B1 | 10/2009 | Barber et al. | |
| 7,629,865 B2 | 12/2009 | Ruby et al. | |
| 7,758,979 B2 | 7/2010 | Akiyama et al. | |
| 7,893,793 B2 | 2/2011 | Iwasaki et al. | |
| 7,966,722 B2 | 6/2011 | Hart et al. | |
| 7,986,198 B2 | 7/2011 | Nakatsuka et al. | |
| 8,456,257 B1 | 6/2013 | Fattinger | |
| 8,902,023 B2 * | 12/2014 | Choy ............... | H03H 9/02118 310/322 |
| 9,197,185 B2 * | 11/2015 | Zou .................. | H03H 3/04 |
| 9,219,464 B2 * | 12/2015 | Choy ................ | B81B 7/02 |
| 2003/0227357 A1 | 12/2003 | Metzger et al. | |
| 2004/0046622 A1 | 3/2004 | Aigner et al. | |
| 2005/0269904 A1 * | 12/2005 | Oka .................. | H03H 3/02 310/324 |
| 2006/0017352 A1 | 1/2006 | Tanielian | |
| 2007/0205850 A1 | 9/2007 | Jamneala et al. | |
| 2007/0252476 A1 * | 11/2007 | Iwaki .................. | H03H 3/04 310/320 |
| 2008/0129414 A1 | 6/2008 | Lobl et al. | |
| 2008/0258842 A1 | 10/2008 | Ruby et al. | |
| 2009/0127978 A1 | 5/2009 | Asai et al. | |
| 2009/0267457 A1 | 10/2009 | Barber et al. | |
| 2010/0033063 A1 * | 2/2010 | Nishihara .......... | H03H 9/02118 310/365 |
| 2010/0107389 A1 | 5/2010 | Nessler et al. | |
| 2010/0148637 A1 | 6/2010 | Satou | |
| 2010/0187948 A1 | 7/2010 | Sinha et al. | |
| 2010/0327697 A1 | 12/2010 | Choy et al. | |
| 2010/0327994 A1 | 12/2010 | Choy et al. | |
| 2011/0037539 A1 | 2/2011 | Jansman et al. | |
| 2011/0084779 A1 | 4/2011 | Zhang | |
| 2012/0161902 A1 * | 6/2012 | Feng .................. | H03H 9/02118 333/187 |
| 2012/0218057 A1 | 8/2012 | Burak et al. | |
| 2012/0218058 A1 | 8/2012 | Burak et al. | |
| 2012/0218059 A1 | 8/2012 | Burak et al. | |
| 2012/0280767 A1 | 11/2012 | Burak et al. | |
| 2013/0038408 A1 | 2/2013 | Burak et al. | |
| 2013/0063227 A1 | 3/2013 | Burak et al. | |
| 2013/0106534 A1 | 5/2013 | Burak et al. | |
| 2013/0140959 A1 | 6/2013 | Shin et al. | |
| 2013/0235001 A1 | 9/2013 | Yun et al. | |
| 2014/0125203 A1 * | 5/2014 | Choy ................. | H03H 9/02118 310/365 |
| 2014/0139077 A1 * | 5/2014 | Choy ................. | H03H 9/02118 310/365 |

FOREIGN PATENT DOCUMENTS

| | | | |
|---|---|---|---|
| JP | 2003017964 | | 1/2003 |
| JP | 2006-020277 | * | 1/2006 |
| JP | 2008-131194 | | 6/2008 |

OTHER PUBLICATIONS

Ranjan et al. "Strained Hexagonal ScN: A Material with Unusual Structural and Optical Properties," Physical Review Letters, Jun. 27, 2003, vol. 90, No. 25, The American Physical Society, USA, 4 pages.

Farrer et al., "Properties of hexagonal ScN versus wurtzite GaN and InN," Physical Review B, Nov. 20, 2002, vol. 66, No. 20, The American Physical Society, USA, 4 pages.

Constantin et al., "Composition-dependent structural properties in ScGaN alloy films: A combined experimental and theoretical study," Journal of Applied Physics, Dec. 16, 2005, vol. 98, No. 12, American Institute of Physics, USA, 8 pages.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010, 4 pages.

"U.S. Appl. No. 13/232,334, filed Sep. 14, 2011".

Archibald, G. W. , "Experimental Results of Bulk Acoustic Wave Transverse Graded Electrode Patterns", *Proceedings of the 1998 IEEE International Frequency Control Symposiurn* 1998 , 477-483.

Co-pending U.S. Appl. No. 13/151,631, filed Jun. 2, 2011.
Co-pending U.S. Appl. No. 13/074,262, filed Mar. 29, 2011.
Co-pending U.S. Appl. No. 13/036,489, filed Oct. 25, 2012.
Co-pending U.S. Appl. No. 13/658,024, filed Oct. 23, 2012.
Co-pending U.S. Appl. No. 13/955,774, filed Jul. 31, 2013.
Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012.
Co-pending U.S. Appl. No. 13/662,425, filed Oct. 27, 2012.
Co-pending U.S. Appl. No. 13/662,460, filed Oct. 27, 2012.
Co-pending U.S. Appl. No. 13/781,491, filed Feb. 28, 2013.
Non-Final Office Action dated Feb. 26, 2014 from U.S. Appl. No. 13/151,631.

Office Action dated Jun. 3, 2016 in Chinese Application No. 201310446558.8 (Unofficial/non-certified translation provided by foreign agent included).

English language abstract of CN1171382, published Oct. 13, 2004.

(56) References Cited

OTHER PUBLICATIONS

English language abstract of JP2000-514278, published Oct. 24, 2000.

* cited by examiner

ACOUSTIC RESONATOR DEVICE WITH AT LEAST ONE AIR-RING AND FRAME

CROSS REFERENCE TO RELATED APPLICATIONS

This application is a continuation-in-part under 37 C.F.R. §1.53(b) of commonly owned U.S. patent application Ser. No. 13/151,631 to Burak et al. entitled "Film Bulk Acoustic Resonator Comprising a Bridge," filed on Jun. 2, 2011 (now published as U.S. Patent Application Publication No. 2012/0218057), which is a continuation-in-part of commonly owned U.S. patent application Ser. No. 13/074,262 to Burak et al., entitled "Stacked Acoustic Resonator Comprising a Bridge," filed on Mar. 29, 2011 (now published as U.S. Patent Application Publication No. 2012/0218055), which is a continuation-in-part of commonly owned U.S. patent application Ser. No. 13/036,489 to Burak, entitled "Coupled Resonator Filter Comprising Bridge" filed on Feb. 28, 2011 (now published as U.S. Patent Application Publication No. 2012/0218056), which are hereby incorporated by reference in their entireties. This application is a continuation-in-part under 37 C.F.R. §1.53(b) of commonly owned U.S. patent application Ser. No. 13/660,941 to Burak et al. entitled "Acoustic Resonator having Composite Electrodes with Integrated Lateral Features," filed on Oct. 25, 2012 (now issued as U.S. Pat. No. 9,425,764 on Aug. 23, 2016), which is hereby incorporated by reference in its entirety.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a bottom (first) electrode and a top (second) electrode over a cavity. BAW resonators may be used in a wide variety of electronic applications, such as cellular telephones, personal digital assistants (PDAs), electronic gaming devices, laptop computers and other portable communications devices. For example, FBARs operating at frequencies close to their fundamental resonance frequencies may be used as a key component of radio frequency (RF) filters and duplexers in mobile devices.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the main membrane region is defined, roughly, by an overlap between the two plate electrodes and the piezoelectric material, and the peripheral regions are defined as areas outside the main membrane region. Two peripheral regions, in particular, are defined as a region located between the edge of the main membrane region and edge of the air-cavity, and a region of an overlap of at least one plate electrode and the piezoelectric material with the substrate. The main membrane region is subject to electrically excited modes generated by the electric field between the two plate electrodes, and both the main membrane and the peripheral regions are subject to certain derivative modes generated by scattering of energy in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the edges of the main membrane region and the peripheral regions.

The lateral modes facilitate continuity of appropriate mechanical particle velocities and stresses between the electrically driven main membrane region and the essentially non-driven peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, an air-bridge may be formed under the top electrode on the top electrode connecting edge of the acoustic resonator in order to eliminate the transducer effect over the substrate. In another example, a frame may be formed by a conductive or dielectric material within the boundary of the main membrane region to minimize scattering of electrically excited piston mode at top electrode edges and improve confinement of mechanical motion to the main membrane region.

The conventional implementation of these ancillary structural features has a number of potential shortcomings. For instance, depending on their specific design, they may be a source of additional scattering of the piston mode which may outweigh their benefits. Also, some design choices may produce only modest performance improvements while significantly driving up cost. Moreover, the formation of ancillary structural features may degrade structural stability or interfere with the formation of overlying layers.

In addition, conventional FBARs rely on strong confinement of electrically excited piston mode. Strong confinement is provided by the edges of the top and bottom electrodes, as well as ancillary structural features, such as air-rings (e.g., including air-bridges and/or air-wings) and conventional outside frames. While the apparent advantage of strong confinement is that itenforces quasi-clamping of mechanical motion at the edge of the top electrode, it also provides significant acoustic discontinuities, leading to scattering of energy out of the desired piston mode into undesired extensional, shear, flexural and dilatational modes of the whole structure. Accordingly, in view of these and other shortcomings of conventional acoustic resonators, there is a general need for improved acoustic resonator designs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
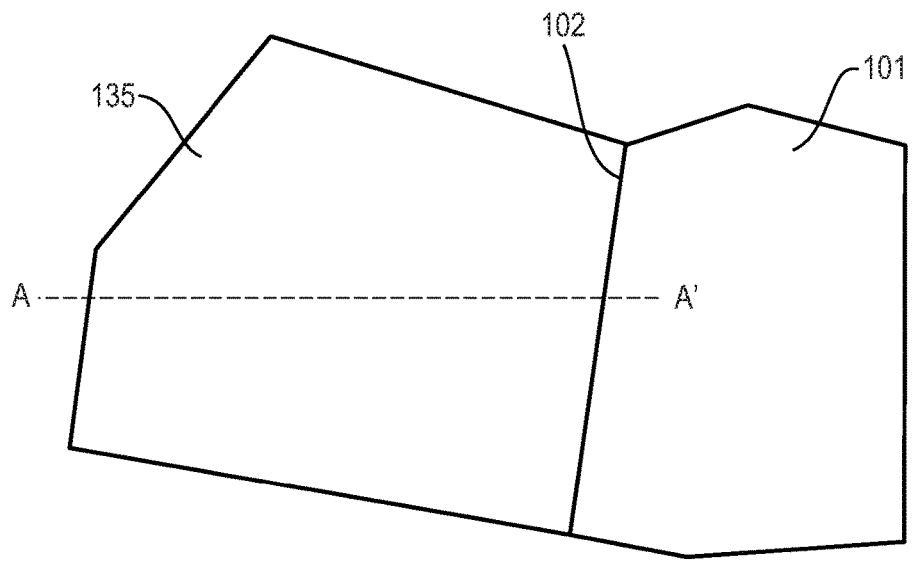
FIG. 1A is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), for example. For simplicity of explanation, several embodiments are described in the context of FBAR technologies; however, the described concepts can be adapted for use in other types of acoustic resonators. Certain details of acoustic resonators, including materials and methods of fabrication, may be found in one or more of the following commonly owned U.S. patents and patent applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. patent application Ser. No. 13/658,024 to Nikkel et al. (issued as U.S. Pat. No. 9,385,684 on Jul. 5, 2016); U.S. patent application Ser. No. 13/955,774 to Burak et al. (issued as U.S. Pat. No. 9,246,473 on Jan. 26, 2016); U.S. patent application Ser. No. 13/663,449 to Burak et al. (issued as U.S. Pat. No. 9,401,692 on Jul. 26, 2016); U.S. patent application Ser. No. 13/660,941 to Burak et al. (issued as U.S. Pat. No. 9,425,764 on Aug. 23, 2016); U.S. patent application Ser. No. 13/654,718 to Burak et al. (issued as U.S. Pat. No. 9,099,983 on Aug. 4, 2015); U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In a representative embodiment, an acoustic resonator device includes a bottom electrode disposed on a substrate over an air cavity, a piezoelectric layer disposed on the bottom electrode, and a top electrode disposed on the piezoelectric layer, where an overlap between the top electrode, the piezoelectric layer and the bottom electrode over the air cavity defines a main membrane region. The acoustic resonator device further includes at least one air-ring defining a boundary of the main membrane region, and at least one first frame formed between the bottom electrode and the piezoelectric layer or formed between the substrate and the bottom electrode. Also, the acoustic resonator device may further include a second frame formed between the piezoelectric layer and the top electrode.

Generally, in various representative embodiments described below, an acoustic resonator comprises an acoustic stack formed by a piezoelectric layer disposed between top and bottom electrodes, disposed on a substrate over an air cavity. An overlap between the top electrode, the piezoelectric layer and the bottom electrode over the air cavity defines a main membrane region. One or more frames may be formed below the bottom electrode, between the bottom electrode and the piezoelectric layer, and/or between the piezoelectric layer and the top electrode, defining an active region within the main membrane region. That is, an inner edge of the frame extending furthest into the main membrane region defines an outer boundary of the active region. In addition, one or more air-rings are formed outside an outer boundary of the main membrane region. The air-ring(s) may be formed between the bottom electrode and the piezoelectric layer and/or between the piezoelectric layer and the top electrode. When an air-ring is formed between the piezoelectric layer and the top electrode, it comprises an air-bridge on the connection side of the top electrode and an air-wing along the remaining outside perimeter.

A frame may be formed by adding a layer of material, usually an electrically conducting material (although dielectric material is possible as well), to the bottom electrode and/or the top electrode. The frame can be either a composite frame or an add-on frame. A composite frame has integrated lateral features, formed of aluminum (Al) and molybdenum (Mo), for example, and is formed by embedding different material within the top or bottom electrode, typically with an exposed upper or lower surface being coplanar with an upper or lower surface of the bottom or top electrode, respectively. An add-on frame is formed by depositing the material above or below of a layer forming either the bottom or top electrode along a perimeter of the active region. The use of a composite frame may simplify fabrication of the acoustic resonator with regard to application of layers on planar surfaces. For instance, it can prevent formation of outcroppings in overlying layers, which can preserve the structural stability of the acoustic resonator. A region of the acoustic resonator above and below the frame (and bordered by an air-ring) may be collectively referred to as a frame region.

The frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cutoff frequency mismatch and an acoustic impedance mismatch between the frame region and other portions of the active region. A frame that lowers the cutoff frequency in the frame region as compared to the active region may be referred to as a Low Velocity Frame (LVF), while a frame that increases the cutoff frequency in the frame region as compared to the main active region may be referred to as a High Velocity Frame (HVF). The reasoning behind this nomenclature is that for composite frames (for which thicknesses of the frame and active regions are substantially the same), an increase or decrease of the cutoff frequency is substantially equivalent to an increase or decrease an effective sound velocity of the acoustic stack forming the frame, respectively.

A composite or add-on frame with lower effective sound velocity than the corresponding effective sound velocity of the active region (i.e., an LVF) generally increases parallel resistance Rp and Q-factor of the acoustic resonator above the cutoff frequency of the active region. Conversely, a composite or add-on frame with a higher effective sound velocity than the corresponding effective sound velocity of the active region (i.e., an HVF) generally decreases series resistance Rs and increases Q-factor of the acoustic resonator below the cutoff frequency of the main active region. A typical low velocity frame, for example, effectively provides a region with significantly lower cutoff frequency than the active region and therefore minimizes the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at active/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

Various additional examples of frames, as well as related materials and operating characteristics, are described in the above cited U.S. patent application Ser. Nos. 13/663,449 (issued as U.S. Pat. No. 9,401,692 on Jul. 26, 2016) and 13/660,941 to Burak et al. (issued as U.S. Pat. No. 9,425,764 on Aug. 23, 2016). As explained in those applications, frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonance frequency, series resistance Rs, parallel resistance Rp, or electromechanical coupling coefficient $Kt^2$. Although the following description presents several embodiments in the form of FBAR devices, several of the described concepts could be implemented in other forms of acoustic resonators, such as SMRs, for example.

FIG. 1A is a top view of an acoustic resonator 100A according to a representative embodiment, and FIGS. 1B-1F are cross-sectional views of acoustic resonator 100A, taken along a line A-A" according to different embodiments. The cross-sectional views correspond to different variations of acoustic resonator 100A and will be referred to, respectively, as acoustic resonators 100B-100F. Acoustic resonators 100B-100F have many of the same features, so a repetitive description of these features may be omitted in an effort to avoid redundancy.

Referring to FIG. 1A, acoustic resonator 100A comprises a top electrode 135 having five (5) sides, with a connection side 101 configured to provide an electrical connection to interconnect 102. Interconnect 102 provides electrical signals to top electrode 135 to excite desired acoustic waves in a piezoelectric layer (not shown in FIG. 1A) of acoustic resonator 100A.

The five sides of top electrode 135 have different lengths, forming an apodized pentagon shape. In alternative embodiments, top electrode 135 may have a different number of sides. Although not shown in the drawings, other embodiments of acoustic resonators, such as those of FIGS. 2A through 6F, may have an appearance similar to that of FIG. 1A when viewed from the top.

FIGS. 1B-1F are cross-sectional diagrams illustrating acoustic resonators, according to representative embodiments. In the examples depicted in FIGS. 1B-1F (as well as the examples depicted in FIGS. 2A to 6B, discussed below), the acoustic resonator is an FBAR, for convenience of explanation. However, it is understood that other types of acoustic resonators may be included, without departing from the scope of the present teachings. Each of the acoustic resonators shown in FIGS. 1B to 1F includes a cavity formed in a substrate. In alternative configurations, an acoustic reflector or acoustic mirror, such as a distributed Bragg reflector (DBR), may formed on the substrate in place of the cavity, making the acoustic resonator an SMR, or formed on the substrate in addition to the cavity. Various illustrative fabrication techniques of acoustic mirrors are described by in U.S. Pat. No. 7,358,831 (Apr. 15, 2008), to Larson III, et al., which is hereby incorporated by reference in its entirety. It is understood that the same general configurations may be included in acoustic resonators having frames and/or air-rings in various locations, without departing from the scope of the present teachings.

Figure 1B:
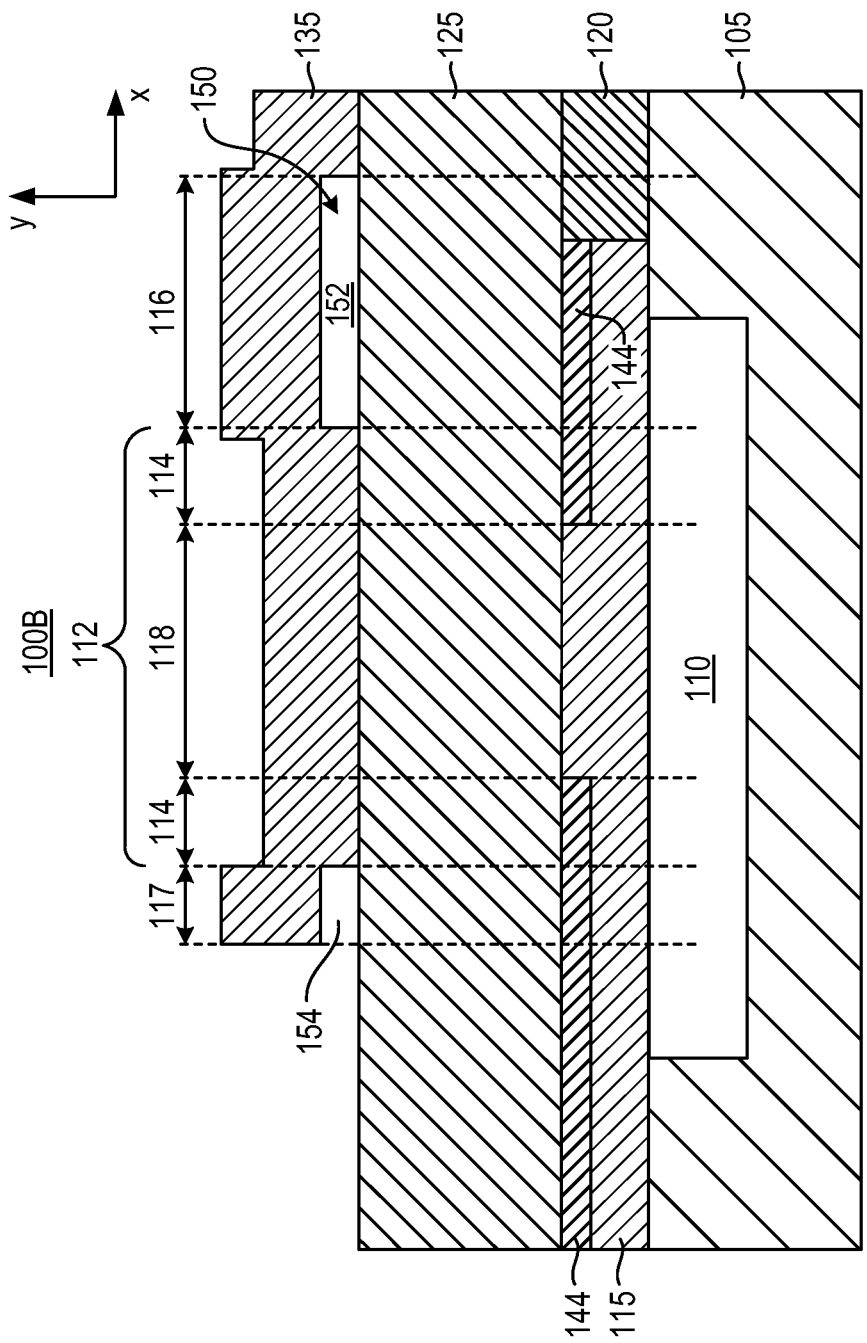
FIG. 1B is a cross-sectional view of an acoustic resonator according to a representative embodiment.

Referring to FIG. 1B, acoustic resonator 100B (e.g., an FBAR) comprises a substrate 105 defining an air cavity 110, a bottom (first) electrode 115 disposed on the substrate 105 and air cavity 110, a planarization layer 120 disposed adjacent to bottom electrode 115 on the substrate 105, a piezoelectric layer 125 disposed on the bottom electrode 115 and the planarization layer 120, and a top (second) electrode 135 disposed on the piezoelectric layer 125. Collectively, bottom electrode 115, the piezoelectric layer 125, and the top electrode 135 constitute an acoustic stack of acoustic resonator 100B. Also, an overlap among the bottom electrode 115, the piezoelectric layer 125 and the top electrode 135 over the air cavity 110 defines a main membrane region 112 of the acoustic resonator 100B. Dotted vertical lines indicate the boundary of the main membrane region 112. Although not shown, a passivation layer may be present on top of top electrode 135 (in each embodiment) with thickness sufficient to insulate all layers of the acoustic stack from the environment, including protection from moisture, corrosives, contaminants, debris and the like.

A top air-ring 150 is formed between the piezoelectric layer 125 and the top electrode 135, and defines an outside boundary of the main membrane region 112. The top air-ring 150 extends along all or a portion of the perimeter of the acoustic resonator 100B. In the cross-sectional view, the top air-ring 150 includes an air-bridge 152 and an air-wing 154. The width of the air-bridge 152 defines an air-bridge extension region 116 adjacent the main membrane region 112. Likewise, the width of the air-wing 154 defines an air-wing region 117, also adjacent the main membrane region 112. Dotted vertical lines indicate the boundaries of air-bridge extension region 116 and the air-wing region 117, respectively. The air-bridge 152 and the air-wing 154 have respective inner edges that substantially define an outer boundary of the main membrane region 112.

The air-bridge 152 is disposed on connection side 101 (in FIG. 1A), and therefore is enclosed by the top electrode 135. The air-wing 154 is disposed along the remaining sides of the acoustic resonator 100B (i.e., along the remaining perimeter), and therefore is open on one side. Although air-bridge 152 and air-wing 154 are shown with rectangular cross-sections, these structures (and other air-bridges or air-wings described herein) may have other shapes, such as trapezoidal cross-sectional shapes, without departing from the scope of the present teachings. Examples of configurations, dimensions, alternative shapes, and the like with regard to air-bridges and/or air-wings are described and illustrated in U.S. Patent Application Publication No. 2012/0218057 (published Aug. 30, 2012) to Burak et al., U.S. Patent Application Publication No. 2010/0327697 (published Dec. 30, 2010) to Choy et al.; and U.S. Patent Application Publication No. 2010/0327994 (published Dec. 30, 2010) to Choy et al., the disclosures of which are hereby incorporated by reference in their entireties.

In certain embodiments, the air-ring 150 (and other air-rings described in connection with representative embodiments below) extends over the cavity 110 by an overlap (also referred to as decoupling region), determining separation of the outer edge of the main membrane region 112 from the substrate 105 edge. Also, the air-bridge 152 of the air-ring 150 extends over the piezoelectric layer 125 by an air-bridge extension (also referred to as the air-bridge extension region 116, mentioned above). The decoupling region has a width (x-dimension) of approximately 0.0 µm (i.e., no overlap with the cavity 110) to approximately 10.0 µm, and the air-bridge extension region 116 has a width of approximately 0.0 µm (i.e., no air-bridge) to approximately 50.0 µm.

Generally, optimum widths of the decoupling region and the air-bridge extension region 116 of the air-bridge 152 (and other air-bridges described in connection with representative embodiments below) depend on the reflection and suppression of the eigen-modes at the boundary of the main membrane region 112 and the decoupling region (i.e., the cavity overlap). Due to substantially increased cut-off frequency of the combined bottom electrode 115 and piezoelectric layer 125 stack in the decoupling region, only complex evanescent modes (for the thickness-extensional motion) and propagating flexural and dilatational modes can exist at the operating frequency of the acoustic resonator 100B. Also, due to substantially increased cut-off frequency of the top electrode 135 in the air-bridge extension region 116, only complex evanescent modes (for the thickness-extensional motion) and propagating flexural and dilatational modes can exist at the operating frequency of the acoustic resonator 100B. The complex evanescent modes in the decoupling region and the air-bridge extension region 116 are characterized by a characteristic decay length and by a specific propagation constant. Thus the air-bridge 152, for example, needs to be wide enough to ensure suitable decay of complex evanescent waves excited at the boundary of the main membrane region 112 and the decoupling region and the air-bridge extension region 116.

Generally, wide decoupling region and air-bridge extension region 116 allow for minimizing of tunneling of energy into the substrate 105, where propagating modes exist at the frequency of operation. On the other hand, when the air-bridge extension region 116 of the air-bridge 152 is too wide, reliability issues can arise and it can also limit similar acoustic resonators (not shown) from being placed in proximity (thus unnecessarily increasing the total area of a chip). In practical situations the propagating components of the complex evanescent and propagating flexural and dilatational waves in the decoupling region and the air-bridge extension region 116 may be used to find the optimum widths, respectively. In general, for any single propagating or complex mode, when the width of the decoupling region or the air-bridge extension region 116 of the air-bridge 152 is about equal to an odd multiple of the quarter-wavelength of a given eigen-mode, the reflectivity of that eigen-mode may be further increased, which may be manifested by parallel resistance Rp and Q-factor attaining maximum values. However, since it may be difficult to satisfy such conditions simultaneously for all the complex and propagating eigen-modes supported by both regions, optimization of air-bridge 152 geometry for high parallel resistance Rp and Q-factor values is done numerically and experimentally.

The air-bridge 152 (and other bridges described in connection with representative embodiments below) has a height (y-dimension in the coordinate system of FIG. 1B) of approximately 300 Å to approximately 5000 Å. Notably, the lower limit of the height is determined by the limits of the process of releasing sacrificial material in the forming of the air-bridge 152 (and other bridges described in connection with representative embodiments below), and the upper limit of the height is determined by the quality of layers deposited over the air-bridge 152 (and other bridges described in connection with representative embodiments) and by the quality of subsequent processing of possibly non-planar structures.

The acoustic resonator 100B further comprises a first frame 144 disposed in a top portion of the bottom electrode 115. The first frame 144 has an inner edge that defines a boundary of an active region 118 formed within the main membrane region 112. The outer edges of the first frame 144 may coincide with the outer edges of the bottom electrode 115. A frame region 114 is formed between the inner edge of the first frame 144 (which substantially coincides with the outer boundary of the active region 118) and an inner edge of the top air-ring 150 (which substantially coincides with the outer boundary of the main membrane region 112). Thus, the main membrane region 112 effectively consists of the active region 118 and the frame region 114. Generally, the first frame 144 minimizes scattering of electrically excited piston mode at edges of the top electrode 135, and improves confinement of mechanical motion to the active region 118. Thus, the first frame 144 is able to suppress excitation of propagating modes.

In the embodiment depicted in FIG. 1B, the first frame 144 is a composite frame formed within the bottom electrode 115, such that top surfaces of the first frame 144, the bottom electrode 115 and the planarization layer 120 are substantially planar. In alternative embodiments, as shown in FIG. 1D, for example, the first frame 144 may be an add-on frame (144') formed on the top surface of the bottom electrode 115. Generally, add-on frames are easier to fabricate; however, the thickness of the add-on frames propagate through the piezoelectric layer 125, which may cause formation of voids in the piezoelectric layer 125 if the add-on frame is too thick, as discussed below.

The substrate 105 may be formed of a material compatible with semiconductor processes, such as silicon (Si), gallium arsenide (GaAs), indium phosphide (InP), glass, sapphire, alumina, or the like, for example. The cavity 110 may be formed by etching a cavity in the substrate 105 and filling the etched cavity with a sacrificial material, such as phosphosilicate glass (PSG), for example, which is subsequently removed to leave an air space. Various illustrative fabrication techniques for an air cavity in a substrate are described by U.S. Pat. No. 7,345,410 (Mar. 18, 2008), to Grannen et al., which is hereby incorporated by reference in its entirety.

The bottom electrode 115 may be formed of one or more electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the bottom electrode 115 may be formed of two or more layers of electrically conductive materials, which may by the same as or different from one another. Likewise, the top electrode 135 may be formed of electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the top electrode 135 may be formed of two or more layers of electrically conductive materials, which may by the same as or different from one another. Also, the configuration and/or the material(s) forming the top electrode 135 may be the same as or different from the configuration and/or the material(s) forming the bottom electrode 115.

The piezoelectric layer 125 may be formed of any piezoelectric material compatible with semiconductor processes, such as aluminum nitride (AlN), zinc oxide (ZnO), or zirconate titanate (PZT), for example. Of course, other materials may be incorporated into the above and other features of acoustic resonator 100B (as well as the other acoustic resonator described herein) without departing from the scope of the present teachings. Also, in various embodiments, piezoelectric layer 125 may be "doped" with at least one rare earth element, such as scandium (Sc), yttrium (Y), lanthanum (La), or erbium (Er), for example, to increase the piezoelectric coupling coefficient $e_{33}$ in the piezoelectric layer 125, thereby off-setting at least a portion of the degradation of the electromechanical coupling coefficient $Kt^2$ of the acoustic resonator caused by the top air-ring 150, top air-wing 154, and/or the first frame 144. Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al. (issued as U.S. Pat. No. 9,225,313 on Dec. 29, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties. Of course, doping piezoelectric layers with one or more rare earth elements may be applied to any of various embodiments, including the embodiments described below with reference to FIGS. 1C through 6B.

The first frame 144 may be formed of one or more conductive or dielectric materials, such as copper (Cu), molybdenum (Mo), aluminum (Al), tungsten (W), iridium (Ir), borosilicate glass (BSG), tetraethyl orthosilicate (TEOS), carbon-doped silicon oxide (CDO), silicon carbide (SiC), silicon nitride (SiN), silicon dioxide ($SiO_2$), aluminum oxide ($Al_2O_3$), aluminum nitride (AlN), zinc oxide (ZnO), lead zirconium titanate (PZT), diamond or diamond-like carbon (DLC), for example. The planarization layer 120 may be formed of borosilicate glass (BSG), for example. The planarization layer 120 is not strictly required for the functioning of acoustic resonator 100B, but its presence can confer various benefits. For instance, the presence of the planarization layer 120 tends to improve the structural stability of acoustic resonator 100B, may improve the quality of growth of subsequent layers, and may allow bottom electrode 115 to be formed without its edges extending beyond the cavity 110. Further examples of potential benefits of planarization are presented in U.S. Patent Application Publication No. 2013/0106534 (published May 2, 2013) to Burak et al., which is hereby incorporated by reference in its entirety.

During illustrative operation of the acoustic resonator 100B (e.g., as a part of a ladder filter), an input electrical signal is applied to an input terminal of bottom electrode 115 and top electrode 135 is connected to the output terminal. The input electrical signal typically comprises a time-varying voltage that causes vibration in the main membrane region 112. This vibration in turn produces an output electrical signal at an output terminal of top electrode 135. The input and output terminals may be connected to bottom and top electrodes 115 and 135 via connection edges that extend away from the main membrane region 112 as shown in FIG. 1B. The input and output terminals of acoustic resonator 100B may be connected to appropriate terminals of other acoustic resonators forming the ladder filter, for instance.

In a conventional FBAR, the electrically excited piston mode is terminated at the edges of a region where bottom electrode 115, piezoelectric layer 125 and top electrode 135 overlap. The structural discontinuities formed by these edges present significant discontinuities in cutoff frequencies between the main membrane and peripheral regions, and they cause excitation of lateral modes in both the main membrane and peripheral regions to facilitate continuity of appropriate particle velocity and stress components at the interface between these regions. This can lead to undesirable scattering of acoustic energy from the piston mode and the resulting degradation of electrical response of the acoustic resonator. Nevertheless, as will be apparent from the following description of FIGS. 1A and 1B, the combined presence of top air-ring 150 and frame 144 can be used to address these and other forms of scattering and related degradation of performance.

For example, the first frame 144 suppresses electrically excited piston mode in the frame region 114, and it reflects and otherwise resonantly (exponentially) suppresses propagating (evanescent and complex) eigenmodes in lateral directions, with both effects simultaneously improving operation of the acoustic resonator 100B. In other words, performance improvement of the acoustic resonator 100B is facilitated by at least one of a cut-off frequency mismatch and an acoustic impedance mismatch between the frame region 114 and the active region 118 of the main membrane region 112, which is produced by first frame 144.

The air-bridge 152 essentially minimizes a detrimental impact of a so-called "dead-FBAR" region in which acoustic vibrations of the acoustic resonator may be attenuated through mechanical scattering of the electrically excited piston mode a boundary between the bottom electrode 115 and the underlying substrate 105 (at the edge of the cavity 110) and through the transducer effect in the region where the acoustic stack comprising the bottom electrode 115, the piezoelectric layer 125 and the top electrode 135 overlaps the substrate 105. The air-wing 154 provides resonant suppression of total motion at the edge of the main membrane region 112, resulting in suppression of flexural, dilatational and complex evanescent modes supported by a outside region, that is region where the bottom electrode 115 and the piezoelectric layer 125 are surrounded by air from below and above. Both the air-bridge 152 and the air-wing 154 have widths (x-dimension in FIG. 1B) corresponding to the air-bridge region extension region 116 and the air-wing region 117, respectively, optimized for best performance of the acoustic resonator 100B.

The air-bridge 152 is typically designed to be wide enough to cross over the bottom electrode 115 edge (as shown in FIG. 1B) and to ensure suitable decay of complex evanescent waves excited at the boundary of main membrane region 112 and the air-bridge extension region 116. The air-wing 154 is typically designed to have a width corresponding to resonant enhancement of parallel resistance Rp resulting from resonant suppression of propagating modes supported by main membrane region 112 and the outside regions. As mentioned above, if the air-bridge 152 or the air-wing 154 is too wide, reliability issues can arise and can also limit the placement of similar FBARs (not shown) from being placed in proximity (thus unnecessarily increasing the total area of a chip). In addition, increased width of the air-wing 154 generally results in decrease in the electromechanical effective coupling coefficient $Kt^2$ due to increased through-air capacitive coupling of the top electrode 135 with the acoustic stack comprising the piezoelectric layer 125 and the bottom electrode 115, which in turn results in a degradation of insertion loss ($S_{21}$) of a filter comprising FBARs. Thus, in general, optimum widths of the air-bridge 152 and air-wing 154 may be determined experimentally and numerically to meet the electrical performance and reliability requirements of the product comprising the acoustic resonator 100B.

As mentioned above, the top air-ring 150, comprising the air-bridge 152 and the air-wing 154, typically defines a perimeter along the main membrane region 112 of the acoustic resonator 100B. The main membrane region 112 thus includes the portions of the acoustic resonator 100B disposed over the air cavity 110 and bounded by the perimeter provided by the top air-ring 150. Accordingly, the main membrane region 112 is bordered around its perimeter by an acoustic impedance discontinuity created at least in part by air-bridge 152 and air-wing 154, and above and below (the air cavity 110) by an acoustic impedance discontinuity due to the presence of air. Thus, a resonant cavity is beneficially provided in the main membrane region 112 of the acoustic resonator 100B.

In the depicted embodiment, air-bridge 152 and air-wing 154 are unfilled, i.e., they contain air. In other embodiments, these structures may be "filled", e.g., with a dielectric or metal material to provide the desired acoustic impedance discontinuity. It is noted that the described structures do not necessarily have to extend along all edges of acoustic resonator 100B (as well as the acoustic resonators depicted in FIGS. 1C-6B). For example, they may be provided on only a subset of the five-sided acoustic resonator 100A shown in FIG. 1A.

The acoustic impedance mismatches provided by air-bridge 152 and air-wing 154 cause reflection and suppression of acoustic waves at the boundary that may otherwise propagate out of the main membrane region 112 resulting in energy loss. Accordingly, the air-bridge 152 and the air-wing 154 may serve to suppress excitation on unwanted propagating modes in the main membrane region 112 and outside regions, resulting in better energy confinement within the main membrane region 112 and reduction of energy losses to acoustic radiation in the acoustic resonator 100B. Reducing such losses increases the Q-factor of acoustic resonator 100B. In filter applications of acoustic resonator 100B, for example, as a result of the reduced energy loss, the insertion loss ($S_{21}$) may be beneficially improved.

In general, the depth of air cavity 110 is determined by the etch properties of the sacrificial material and by possible downward bowing of the released membrane (i.e., layers of acoustic resonator 100B disposed over air cavity 110) in the case of residual compressive stress in the layers of the membrane being present. Usually deeper cavities are more beneficial from the membrane release process point of view, but they also yield somewhat more difficult initial etch process.

Figure 1C:
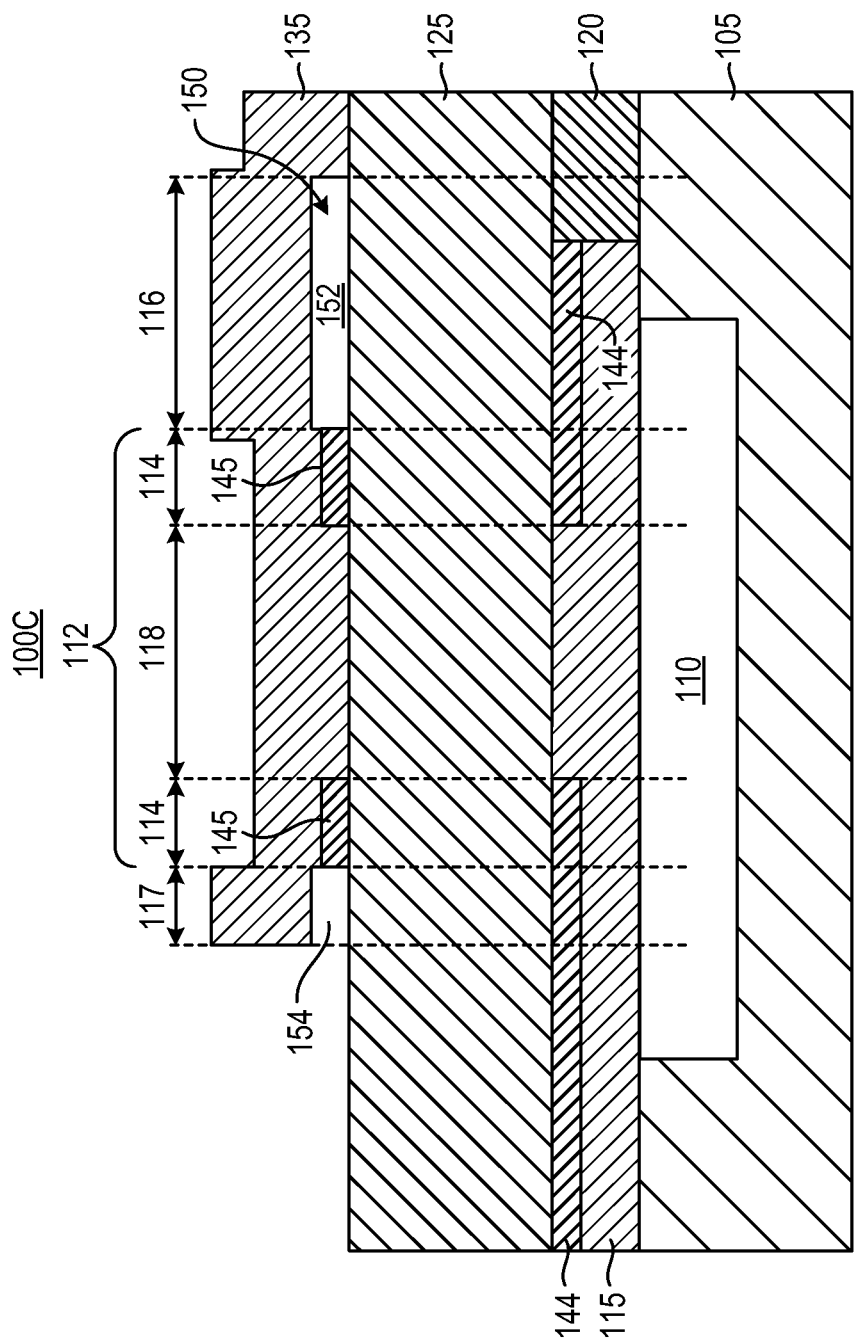
FIG. 1C is a cross-sectional view of an acoustic resonator according to a representative embodiment.
Figure 1D:
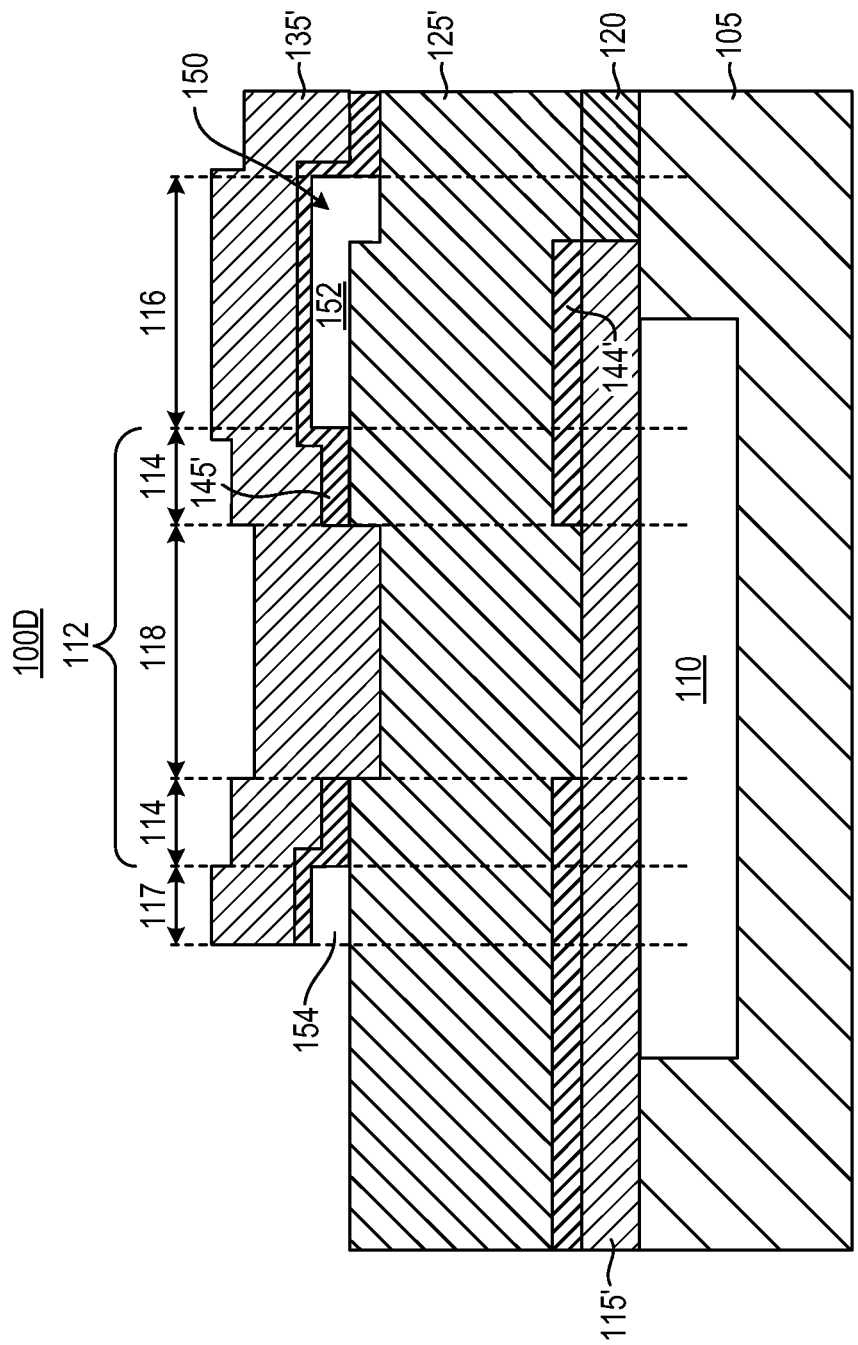
FIG. 1D is a cross-sectional view of an acoustic resonator according to a representative embodiment.

Referring to FIG. 1C, acoustic resonator 100C is similar to the acoustic resonator 100B, except for formation of second frame 145 between the piezoelectric layer 125 and the top electrode 135, in addition to the first frame 144. More particularly, the second frame 145 is a composite frame formed in a bottom portion of the top electrode 135. Because the second frame 145 is a composite frame, the bottom surfaces of the second frame 145 and the top electrode 135 and are substantially planar. The second frame 145 may be formed of the same materials as discussed above with regard to the first frame 144 in FIG. 1B, for example. Otherwise, the acoustic resonator 100C includes substrate 105, cavity 110 formed in the substrate 105, bottom electrode 115 disposed on the substrate 105 over the cavity 110, planarization layer 120 is disposed on the substrate 105 adjacent to the bottom electrode 115, piezoelectric layer 125 disposed on the bottom electrode 115 and the planarization layer 120, top electrode 135 disposed on the piezoelectric layer 125, and the top air-ring 150 formed between the planarization layer 120 and the top electrode 135, as discussed above with regard to FIG. 1B.

In the depicted embodiment, the second frame 145 has an inner edge that is substantially aligned with the inner edge of the first frame 144. Therefore, the inner edge of the second frame 145 and the inner edge of the first frame 144 together define the outer boundary of the active region 118 formed within the main membrane region 112. An outer edge of the second frame 145, which is substantially aligned with an inner edge of the top air-ring 150, substantially coincides with the outer boundary of the main membrane region 112. Thus, the second frame 145 is substantially the same width as the frame region 114, otherwise formed between the outer boundary of the active region 118 and the outer boundary of the main membrane region 112, as discussed above. Generally, the second frame 145 further minimizes scattering of electrically excited piston mode at edges of the top electrode 135, and improves confinement of mechanical motion to the active region 118. Thus, the second frame 145 is able to suppress excitation of propagating modes.

Referring to FIG. 1D, acoustic resonator 100D is similar to the acoustic resonator 100C, except that the first frame 144' formed between the bottom electrode 115 and the piezoelectric layer 125, and the second frame 145' formed between the piezoelectric layer 125 and top electrode 135' are add-on frames. That is, unlike acoustic resonator 100C, in which the first frame 144 is a composite frame integrally formed within the corresponding bottom electrode 115, and the second frame 145 is a composite frame integrally formed within the corresponding top electrode 135 to provide planar top surfaces, respectively, the first and second frames 144' and 145' are add-on frames. The add-on first frame 144' results in a substantially non-planar top surface profile of the piezoelectric layer 125', and the add-on second frame 145' results in a substantially non-planar top surface profile of the top electrode 135'.

Generally, because only a passivation layer (not shown) usually would be formed on the top electrode 135', the non-planar top surface profile of the top electrode 135' would not have any significant impact on structural robustness of the acoustic resonator 100D. However, the non-planar top surface of the piezoelectric layer 125' may present difficulties in formation of the piezoelectric layer 125', the top electrode 135' and/or the top air-ring 150. Therefore, the thickness of the add-on first frame 144' is kept relatively small (e.g., no greater than about 1000 Å). This prevents formation of voids in the piezoelectric layer 125', for example, that may otherwise form in response to a thicker add-on first frame 144'.

In the depicted embodiment, both the add-on first frame 144' and the add-on second frame 145' are shown as one layer having a rectangular cross-section. However, it is understood that one or both of the add-on first frame 144' and the add-on second frame 145' may be formed of multiple stacked layers, which may or may not be stepped, such that the upper layers have consecutively shorter widths than the preceding lower layers on which they are stacked. Such stepped frame structures provide multiple (vertical) interfaces, as described for example in U.S. Patent Application Publication No. 2013/0063227 (published Mar. 14, 2013) to Burak et al., the disclosure of which is hereby incorporated by reference.

Although the acoustic resonator 100D is shown with both the first and second frames 144' and 145' being add-on frames, it is understood that, in alternative configurations, only one of the first or second frames 144' or 145' may be an add-on frame, while the other one may be a composite first or second frame 144 or 145, as discussed above. For example, substantially planar top surfaces are generally preferable, particularly with regard to the bottom electrode 115 as shown in FIG. 1C, to increase the likelihood of forming a high quality, void-free piezoelectric layer 125 and top electrode 135, 135' without restricting the thickness of the first frame 144. Thus, it may be beneficial to have a composite first frame 144 and an add-on second frame 145'. Some additional general tradeoffs of different frame configurations are described, for instance, in the above cited U.S. patent application Ser. No. 13/663,449 (issued as U.S. Pat. No. 9,401,692 on Jul. 26, 2016).

Of course, the structure of the add-on first frame 144' and/or the add-on second frame 145' may be applied to first and second frames included in the acoustic resonators 100E through 600B, discussed below with reference to FIGS. 1E through 6B, respectively, without departing from the scope of the present teachings. Also, in alternative embodiments, the second frame 145, 145' (composite or add-on) may be included in an acoustic resonator, along with the acoustic stack and the top air-ring 150, without the first frame 144, 144'. Other frame configurations (composite or add-on) may also be incorporated, such as additional frame configurations disclosed by U.S. patent application Ser. No. 13/781,491, filed Feb. 28, 2013 (issued as U.S. Pat. No. 9,490,771 on Nov. 8, 2016), for example, without departing from the scope of the present teachings.

Figure 1E:
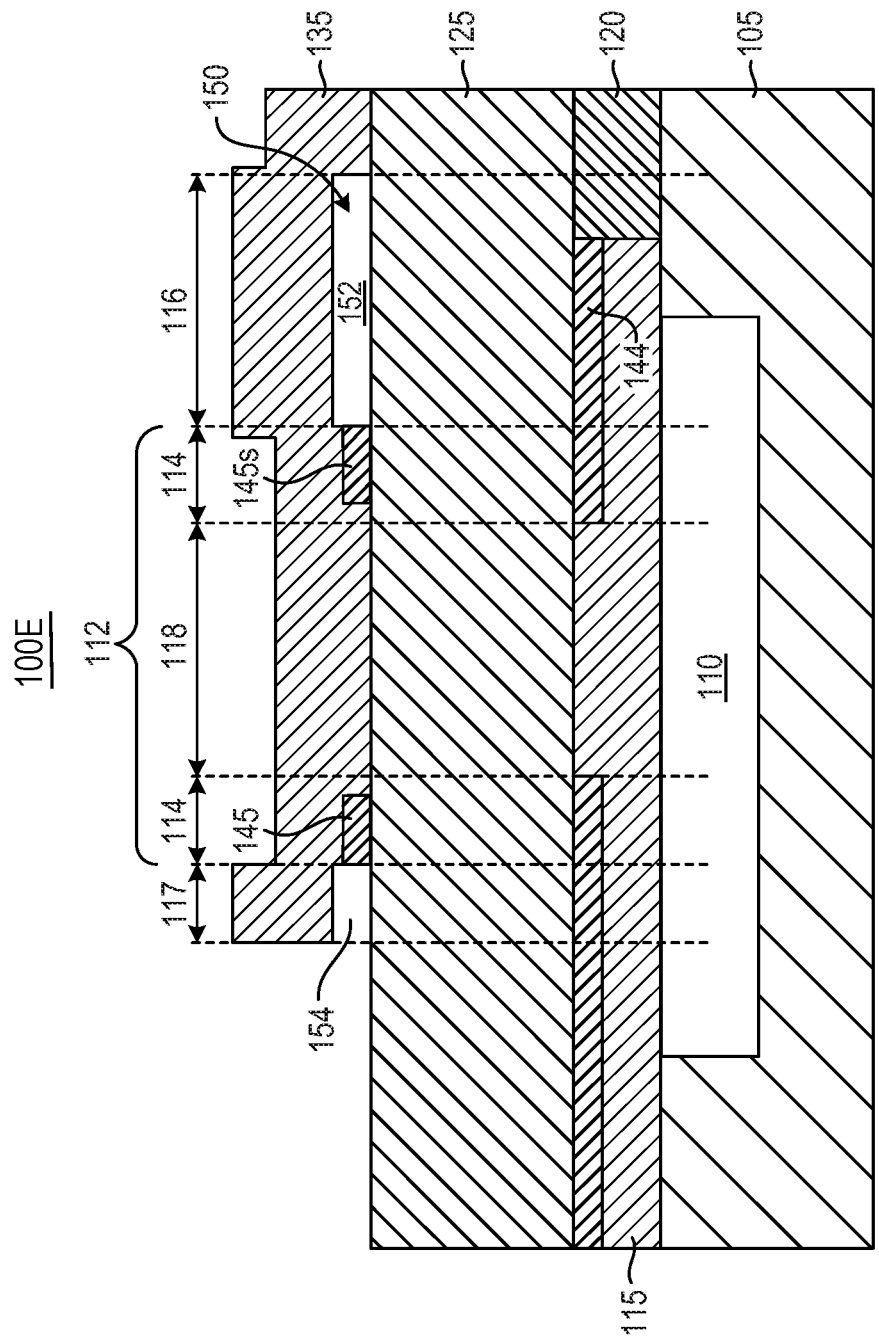
FIG. 1E is a cross-sectional view of an acoustic resonator according to a representative embodiment.
Figure 1F:
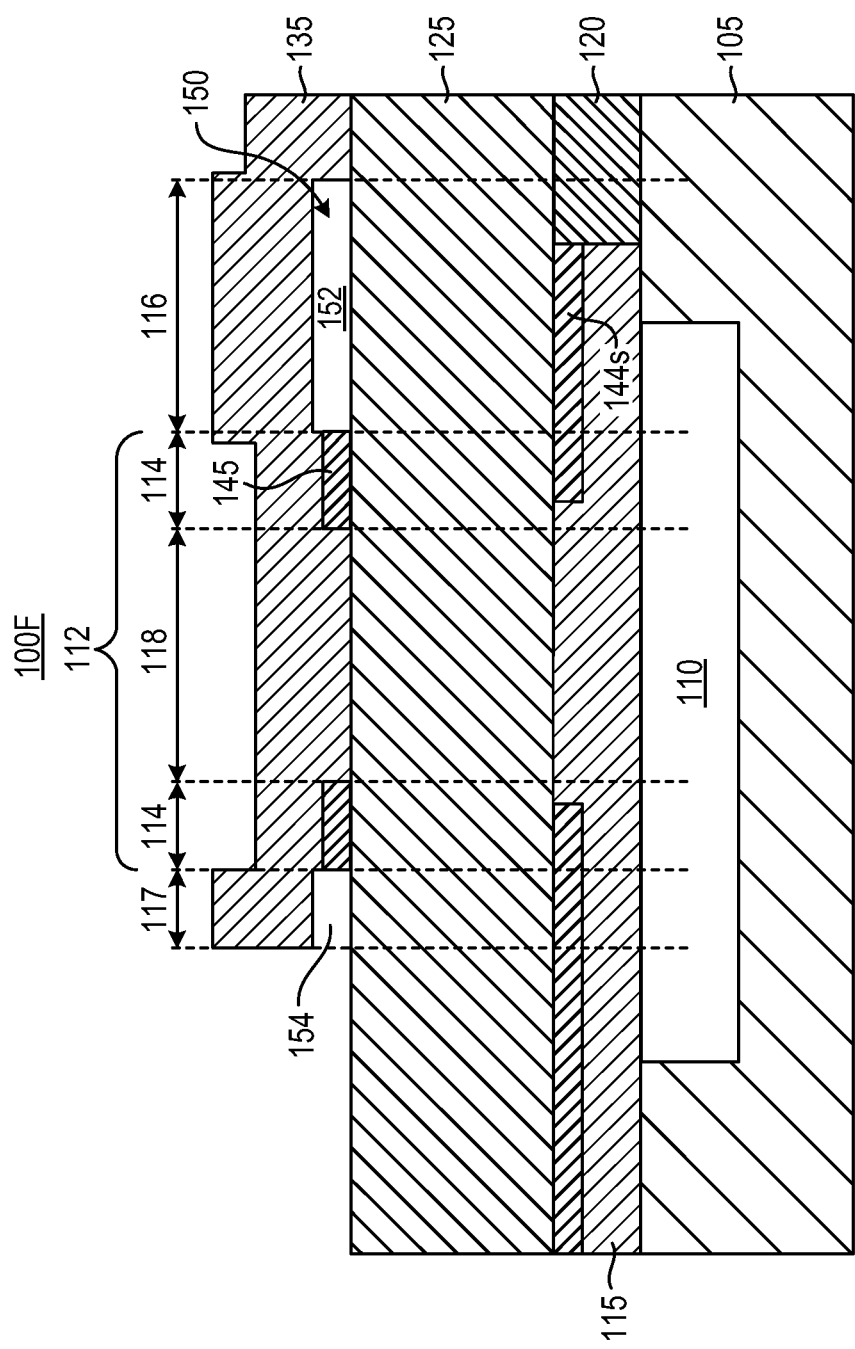
FIG. 1F is a cross-sectional view of an acoustic resonator according to a representative embodiment.

FIGS. 1E and 1F depict additional variations of the acoustic resonator 100C. In particular, in FIG. 1E, acoustic resonator 100E is substantially the same as acoustic resonator 100C, except that the inner edge of the first frame 144 extends further into the main membrane region 112 than the inner edge of the second frame 145s. Therefore, the outer boundary of the active region 118 is defined by the inner edge of the first frame 144, and not the inner edge of the second frame 145s. Similarly, in FIG. 1F, acoustic resonator 100F is substantially the same as acoustic resonator 100C, except that the inner edge of the second frame 145 extends further into the main membrane region 112 than the inner edge of the first frame 144s. Therefore, the outer boundary of the active region 118 is defined by the inner edge of the second frame 145, and not the inner edge of the first frame 144s.

Figure 2A:
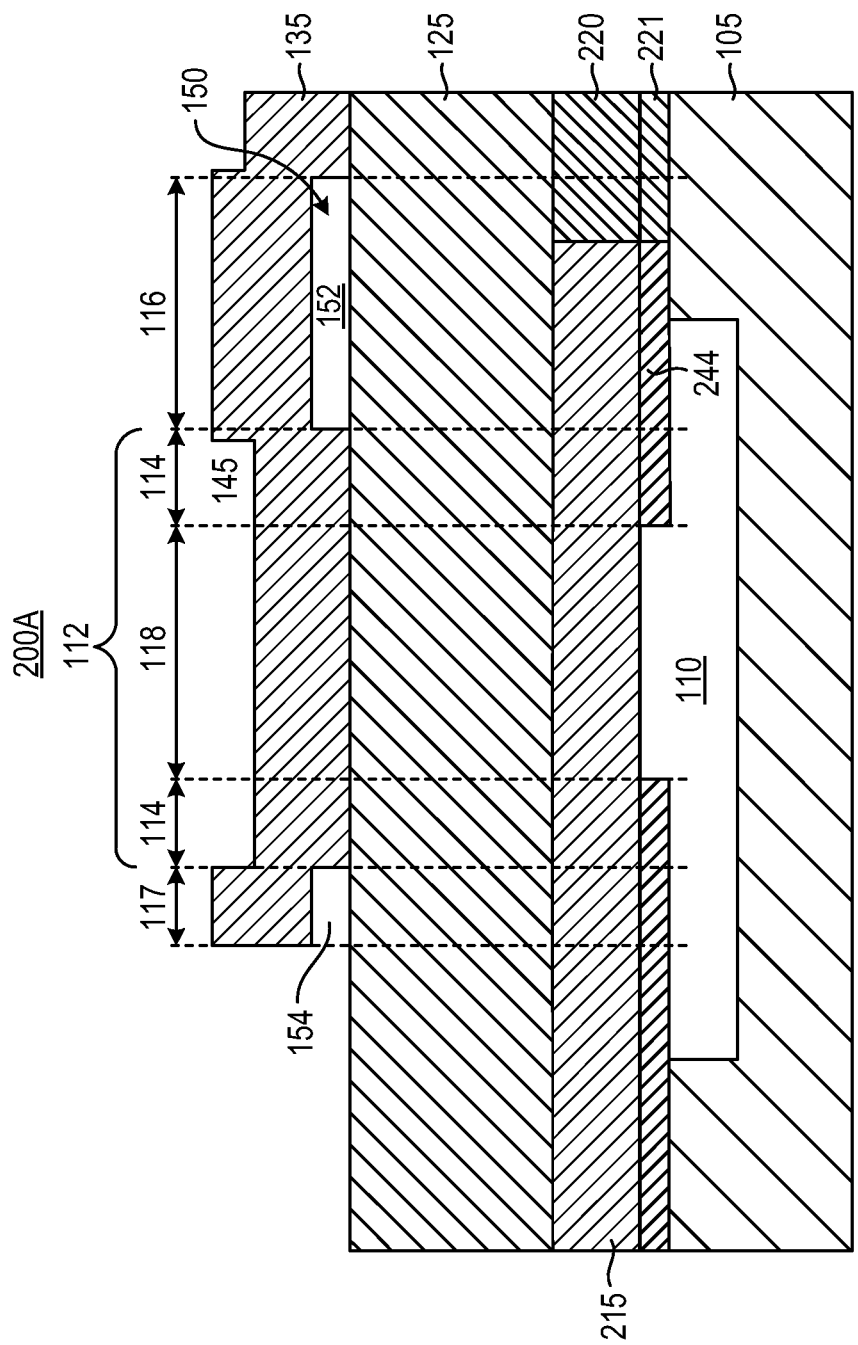
FIG. 2A is a cross-sectional view of an acoustic resonator according to a representative embodiment.
Figure 2B:
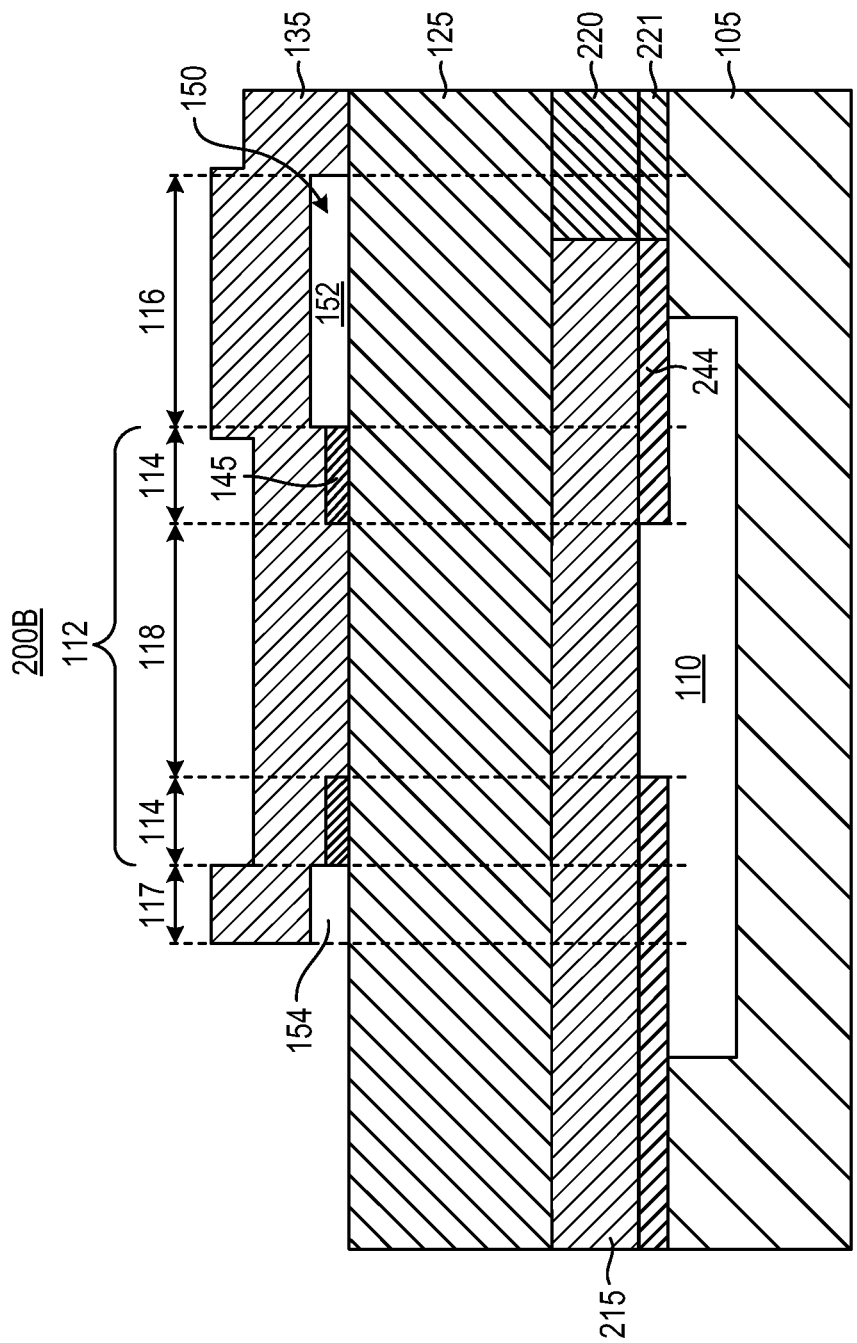
FIG. 2B is a cross-sectional view of an acoustic resonator according to a representative embodiment.
Figure 2C:
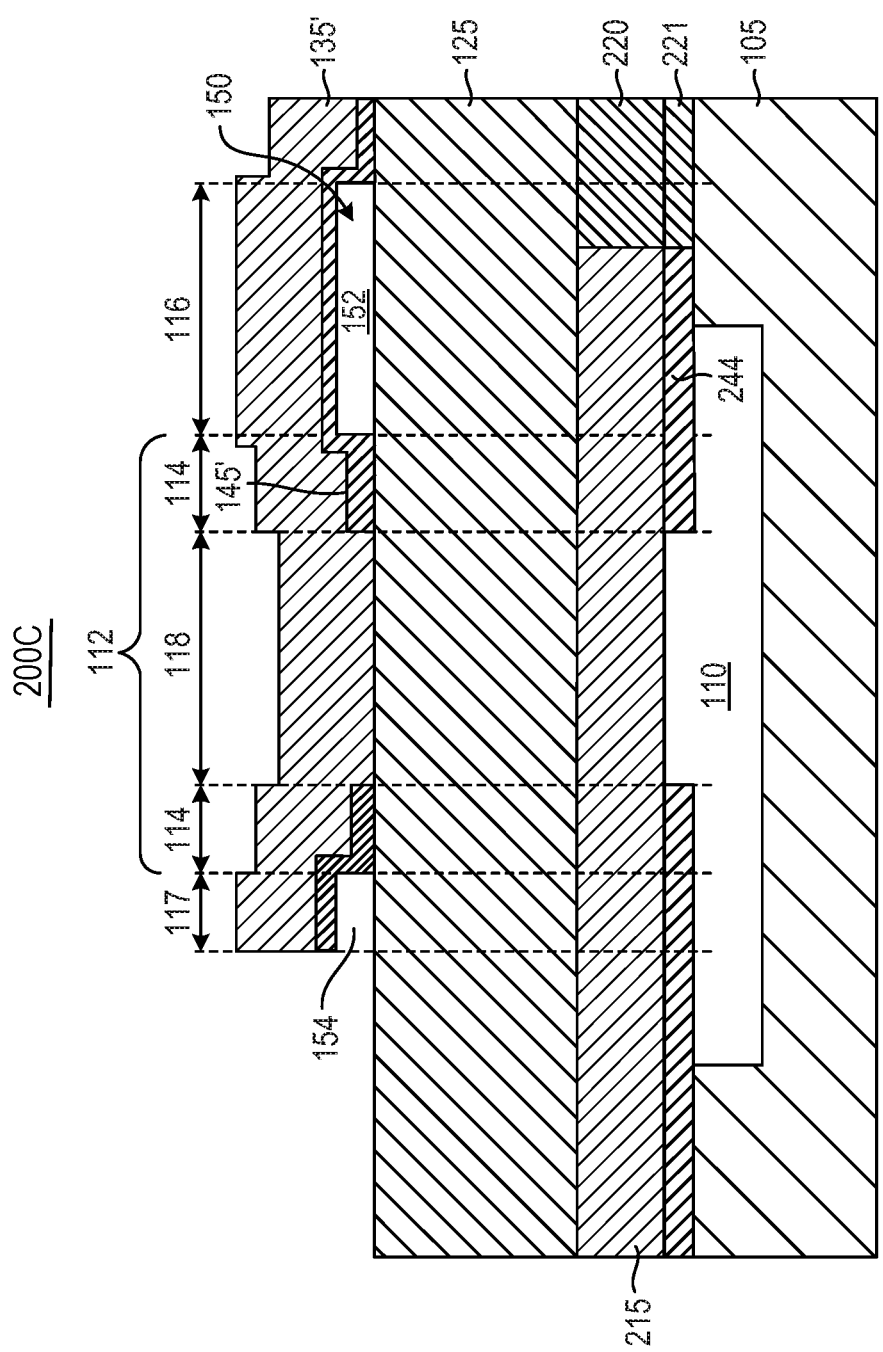
FIG. 2C is a cross-sectional view of an acoustic resonator according to a representative embodiment.

FIGS. 2A-2C are cross-sectional diagrams illustrating acoustic resonators having frames and an air-ring, according to representative embodiments.

Referring to FIG. 2A, acoustic resonator 200A is similar to acoustic resonator 100B, except for the location of the first frame. In particular, first frame 244 in the acoustic resonator 200A is formed between the substrate 105 and the bottom electrode 215, extending into portions of the cavity 110, as compared to the first frame 144 in the acoustic resonator 100B, which is formed between the bottom electrode 115 and the piezoelectric layer 125. In other words, the first frame 244 is formed below the bottom electrode 215. The first frame 244 provides benefits similar to the first frame 144 acoustic resonators 100B through 100F, although its performance and manufacture varies somewhat due to the different location.

According to an embodiment, the first frame 244 may be formed as follows, although other methods of forming the first frame 244 may be included without departing from the scope of the present teachings. After the cavity 110 is formed in the substrate 105 and filled with sacrificial material, the first frame 244 may be deposited on the substrate 105 and the sacrificial material and patterned to provide an opening in the active region 118. Subsequently, the opening in the active region 118 may be filled with the sacrificial material and planarized using chemical-mechanical polishing (CMP) process. After that, a bottom or additional planarization layer 221 may be deposited, patterned and planarized along with the first frame 244 using similar process as presented in presented in U.S. Patent Application Publication No. 2013/0106534 (published May 2, 2013) to Burak et al.

The first frame 244 has an inner edge that defines a boundary of the active region 118 formed within the main membrane region 112. The outer edges of the first frame 144 may coincide with the outer edges of the bottom electrode 215. The frame region 114 is formed between the inner edge of the first frame 244 (which substantially coincides with the outer boundary of the active region 118) and an inner edge of the top air-ring 150 (which substantially coincides with the outer boundary of the main membrane region 112). The first frame 244 and the bottom electrode 215 may be formed of the same materials as discussed above with regard to the first frame 144 and the bottom electrode 115 in FIG. 1B, for example.

As mentioned above, in the depicted embodiment, an additional planarization layer 221 is disposed on the substrate 105 adjacent to the first frame 244, providing a substantially planar upper surface on which the bottom electrode 215 and the planarization layer 220 are formed. That is, the bottom electrode 215 and the adjacent planarization layer 220 are disposed on the first frame 244 and the adjacent additional planarization layer 221. The bottom electrode 215 and the adjacent planarization layer 220 thus provide a substantially planar upper surface on which the piezoelectric layer 125 is formed. The planarization layer 220 and the additional planarization layer 221 may be formed of borosilicate glass (BSG), for example. The top electrode 135 is formed on the piezoelectric layer 125, and the top air-ring 150 (including the air-bridge 152 and the air-wing 154) is formed between the piezoelectric layer 125 and the top electrode 135. An advantage of the configuration of the first frame 244 (and the additional planarization layer 221) is that the bottom electrode 215 provides a planar top surface on which to form the piezoelectric layer 125 without having to include a composite frame, such as first frame 144 as shown in FIG. 1B. Also, the thickness of the first frame 244 is not restricted, as in the case when the first frame 144 is an add-on frame as shown in FIG. 1D.

FIGS. 2B and 2C are cross-sectional views of acoustic resonators having first and second frames and air-rings, according to representative embodiments.

Referring to FIG. 2B, acoustic resonator 200B is similar to acoustic resonator 200A, except that the acoustic resonator 200B includes the second frame 145 in addition to the first frame 244. The second frame 145 is formed between the piezoelectric layer 125 and the top electrode 135, and the first frame 244 is formed between the substrate 105 and the bottom electrode 215, extending into portions of the cavity 110.

As discussed above, the second frame 145 is a composite frame formed in a bottom portion of the top electrode 135, such that the bottom surfaces of the second frame 145 and the top electrode 135 are substantially planar. In the depicted embodiment, the second frame 145 has an inner edge that is substantially aligned with the inner edge of the first frame 244. Therefore, the inner edge of the second frame 145 and the inner edge of the first frame 244 together define the outer boundary of the active region 118 formed within the main membrane region 112. An outer edge of the second frame 145, which is substantially aligned with an inner edge of the top air-ring 150, substantially coincides with the outer boundary of the main membrane region 112.

Referring to FIG. 2C, acoustic resonator 200C is similar to acoustic resonator 200B, except that the second frame 145' in the acoustic resonator 200C is an add-on frame, while the second frame 145 in the acoustic resonator 200B is a composite frame, as discussed above. The second frame 145' is formed between the piezoelectric layer 125 and the top electrode 135, and the first frame 244 is formed between the substrate 105 and the bottom electrode 215, extending into portions of the cavity 110. Because the second frame 145' is an add-on frame in FIG. 2C, the top surface of the top electrode 135' is not planar within the main membrane region 112. Rather, the portions of the top electrode 135' over the add-on second frame 145' are raised to accommodate the thickness of the add-on second frame 145'.

As discussed above with reference to FIGS. 1E and 1F, the inner edge of one of the first frame 244 or the second frame 145, 145' may extend further into the main membrane region 112. In this case, the inner edge of the one of the first frame 244 or the second frame 145, 145' extending further into the main membrane region 112 defines the outer boundary of the active region 118.

Figure 3A:
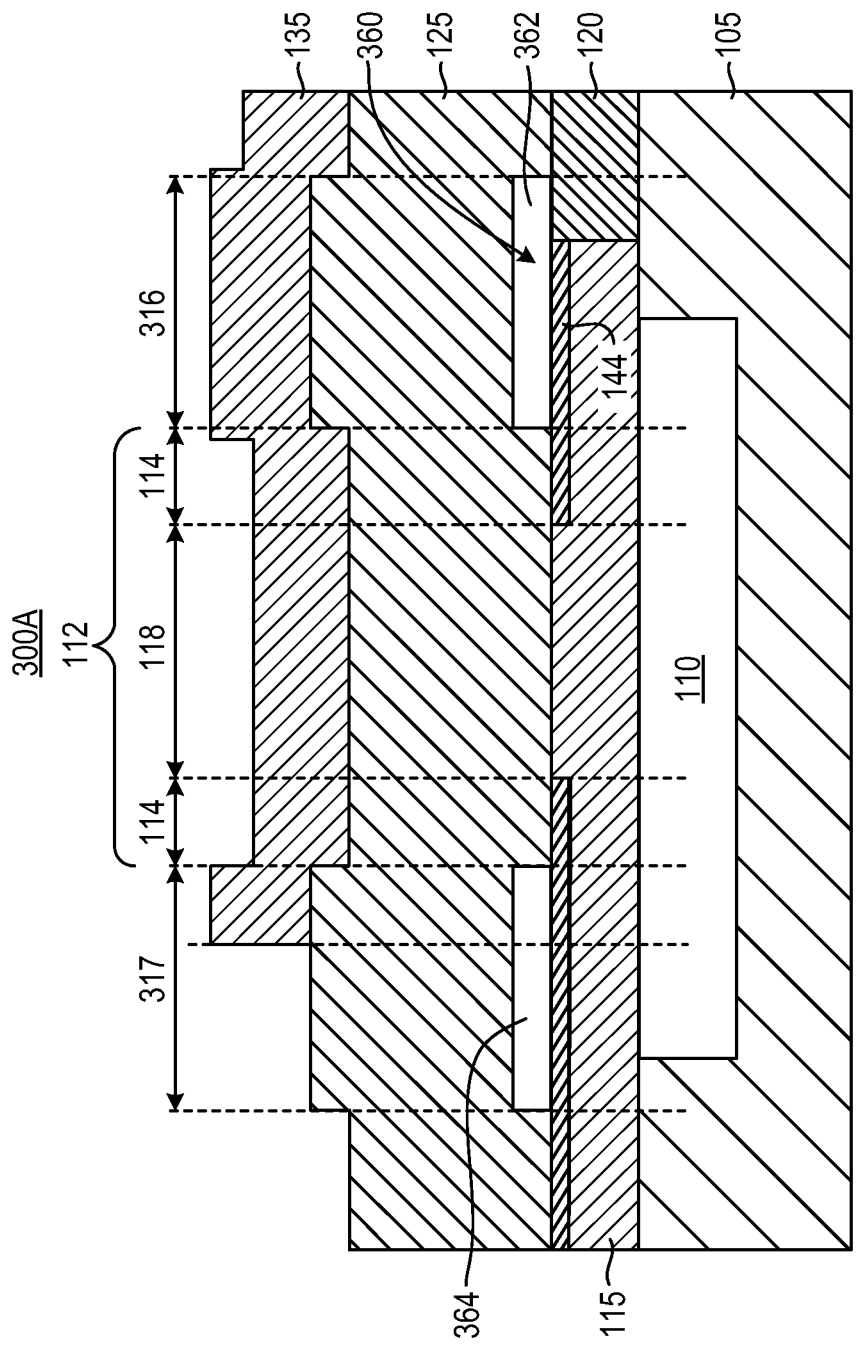
FIG. 3A is a cross-sectional view of an acoustic resonator according to a representative embodiment.
Figure 3B:
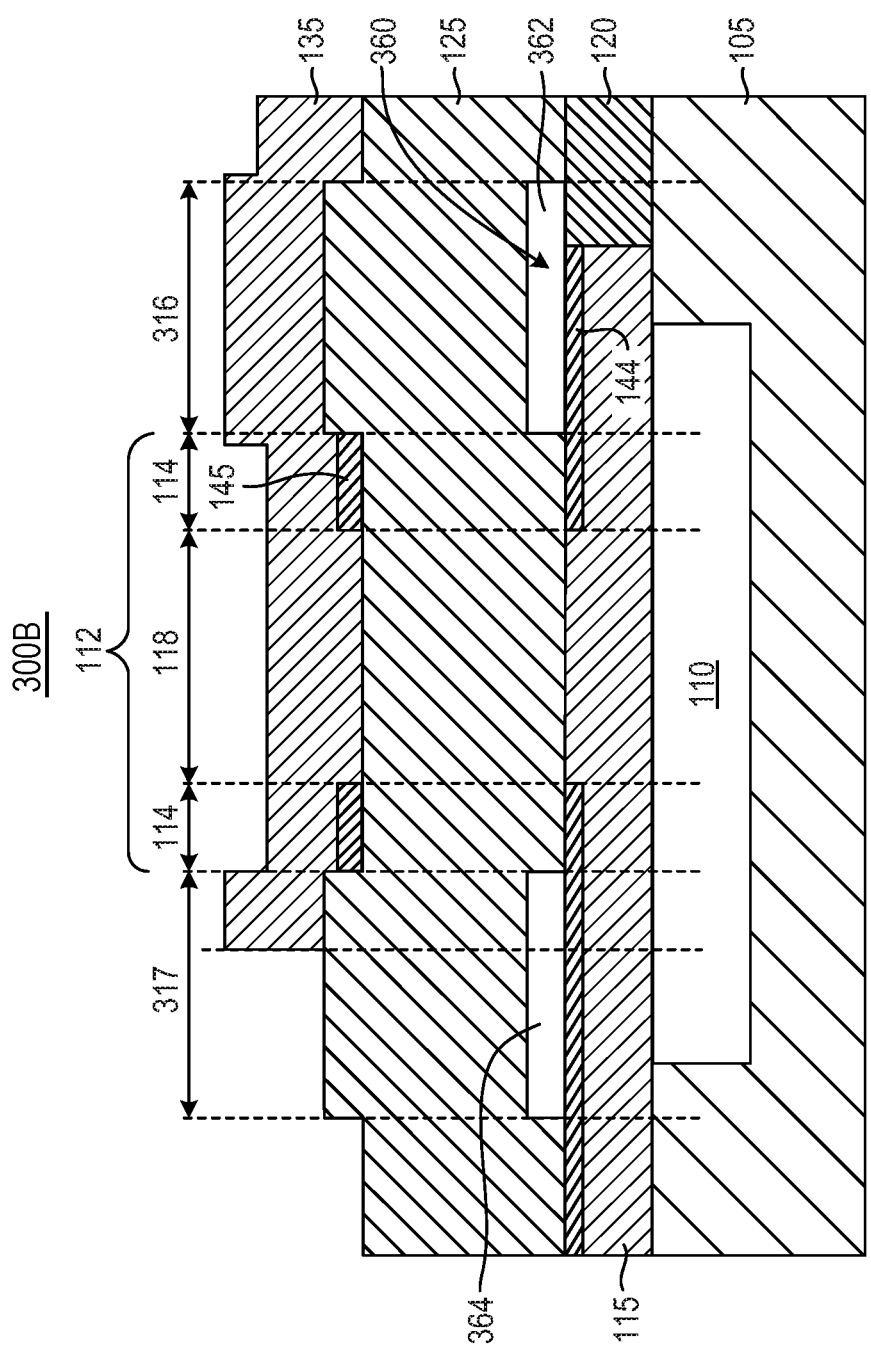
FIG. 3B is a cross-sectional view of an acoustic resonator according to a representative embodiment.

FIGS. 3A-3B are cross-sectional diagrams illustrating acoustic resonators having frames and an air-ring, according to representative embodiments.

Referring to FIG. 3A, acoustic resonator 300A is similar to acoustic resonator 100B, except for the location and configuration of the air-ring. In particular, bottom air-ring 360 in the acoustic resonator 300A is formed between the bottom electrode 115 and the piezoelectric layer 125, as compared to the top air-ring 150 in the acoustic resonator 100B, which is formed between the piezoelectric layer 125 and the top electrode 135. In other words, the bottom air-ring 360 is formed below the piezoelectric layer 125. The bottom air-ring 360 provides benefits similar to the top air-ring 150 in acoustic resonators 100B through 200C, although its performance and manufacture varies somewhat due to the different location.

The bottom air-ring 360 extends along all or a portion of the perimeter of the acoustic resonator 300A. In the cross-sectional view, the bottom air-ring 360 includes air-bridges 362 and 364. Both of the air-bridges 362 and 364 are enclosed by the piezoelectric layer 125. The width of the air-bridge 362 defines an air-bridge extension region 316 adjacent the main membrane region 112. Likewise, the width of the air-bridge 364 defines an air-bridge extension region 317, also adjacent the main membrane region 112. Dotted vertical lines indicate the boundaries of air-bridge extension regions 316 and 317, respectively. Note that the air-bridge extension regions 316 and 317 differ in terms of acoustic stacks formed above them, respectively. The acoustic stack above the air-bridge extension region 316 is formed of the piezoelectric layer 125 and the top electrode 135. The acoustic stack above air-bridge extension region 317 is formed partially by the piezoelectric layer 125 and the top electrode 135 (in the region adjacent to the main membrane region 112) and partially by the piezoelectric layer 125 only. However, both air-bridge extension regions 316 and 317 support similar sets of complex, flexural and dilatational modes as described above in relation to FIG. 1B, and therefore the process of optimizing the geometry of the air-ring 360 for the highest parallel resistance Rp and Q-factor is similar to the process of optimizing the geometry of air-bridge 152 and air-wing 154. The air-bridges 362 and 364 have respective inner edges that substantially define an outer boundary of the main membrane region 112. Although the air-bridges 362 and 364 are shown with rectangular cross-sections, these structures (and other air-bridges described herein) may have other shapes, such as trapezoidal cross-sectional shapes, without departing from the scope of the present teachings.

The acoustic resonator 300A further comprises the first frame 144 disposed in a top portion of the bottom electrode 115. The inner edge of the first frame 144 defines a boundary of the active region 118 formed within the main membrane region 112. The outer edges of the first frame 144 may coincide with the outer edges of the bottom electrode 115. A frame region 114 is formed between the inner edge of the first frame 144 (which substantially coincides with the outer boundary of the active region 118) and an inner edge of the bottom air-ring 360 (which substantially coincides with the outer boundary of the main membrane region 112). Thus, the main membrane region 112 effectively consists of the active region 118 and the frame region 114.

In the embodiment depicted in FIG. 3A, the first frame 144 is a composite frame formed within the bottom electrode 115, such that top surfaces of the first frame 144, the bottom electrode 115 and the planarization layer 120 are substantially planar. Although, in alternative embodiments, the first frame 144 may be an add-on frame (144') formed on the top surface of the bottom electrode 115.

Referring to FIG. 3B, acoustic resonator 300B is similar to acoustic resonator 300A, except that the acoustic resonator 300B includes the second frame 145 in addition to the first frame 144. The second frame 145 is formed between the piezoelectric layer 125 and the top electrode 135, and the first frame 144 is formed between the bottom electrode 115 and the piezoelectric layer 125. Otherwise, the acoustic resonator 300B includes the bottom air-ring 360 that extends along all or a portion of the perimeter of the acoustic resonator 300B, and includes air-bridges 362 and 364, as discussed above.

As discussed above, the second frame 145 is a composite frame formed in a bottom portion of the top electrode 135. In the depicted embodiment, the second frame 145 has an inner edge that is substantially aligned with the inner edge of the first frame 144. Therefore, the inner edge of the second frame 145 and the inner edge of the first frame 144 together define the outer boundary of the active region 118 formed within the main membrane region 112. An outer edge of the second frame 145, which is substantially aligned with an inner edge of the bottom air-ring 360, substantially coincides with the outer boundary of the main membrane region 112. Of course, in various embodiments, one or both of the composite first or second frames 144 or 145 may be replaced with add-on first or second frames 144' or 145' without departing from the scope of the present teachings.

Figure 4A:
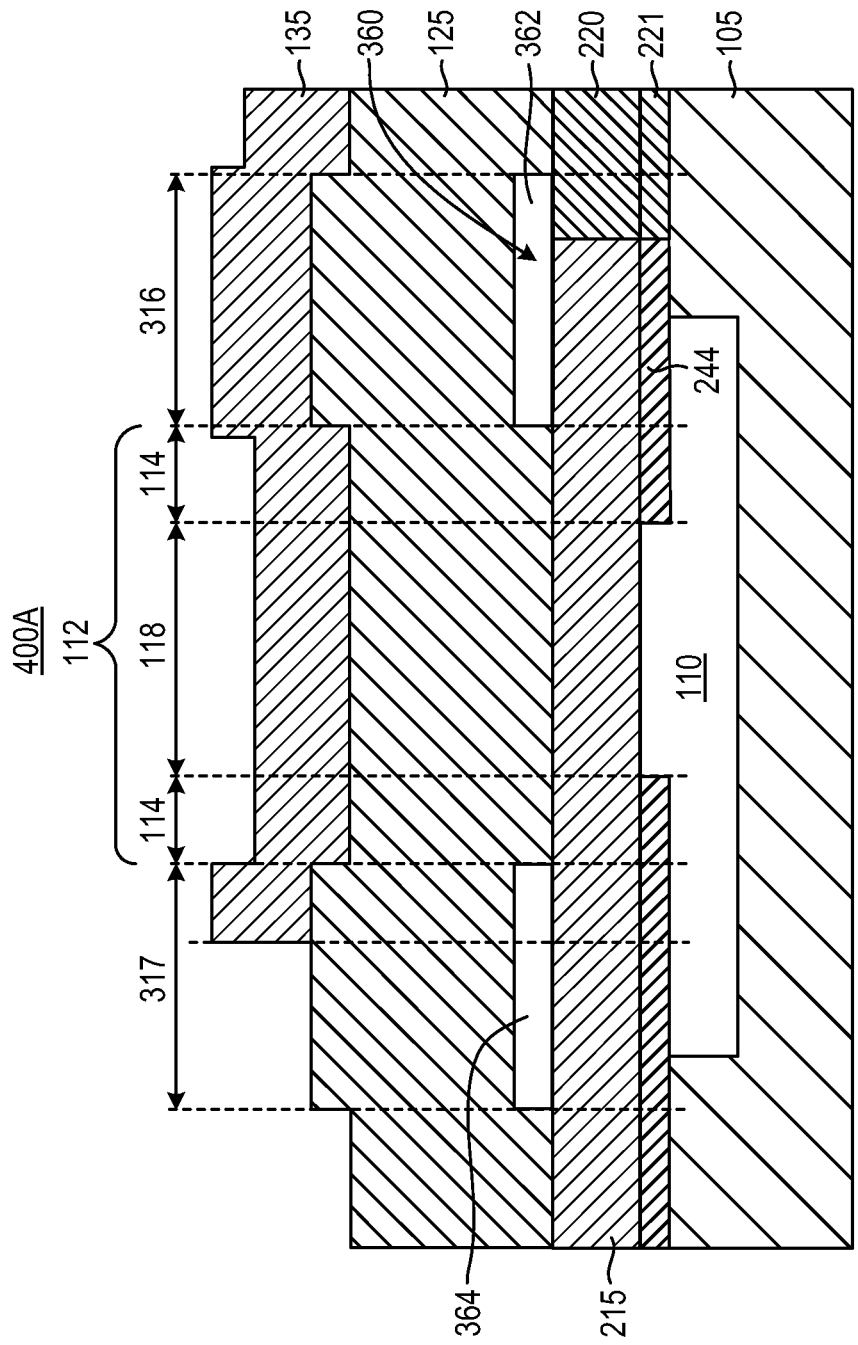
FIG. 4A is a cross-sectional view of an acoustic resonator according to a representative embodiment.
Figure 4B:
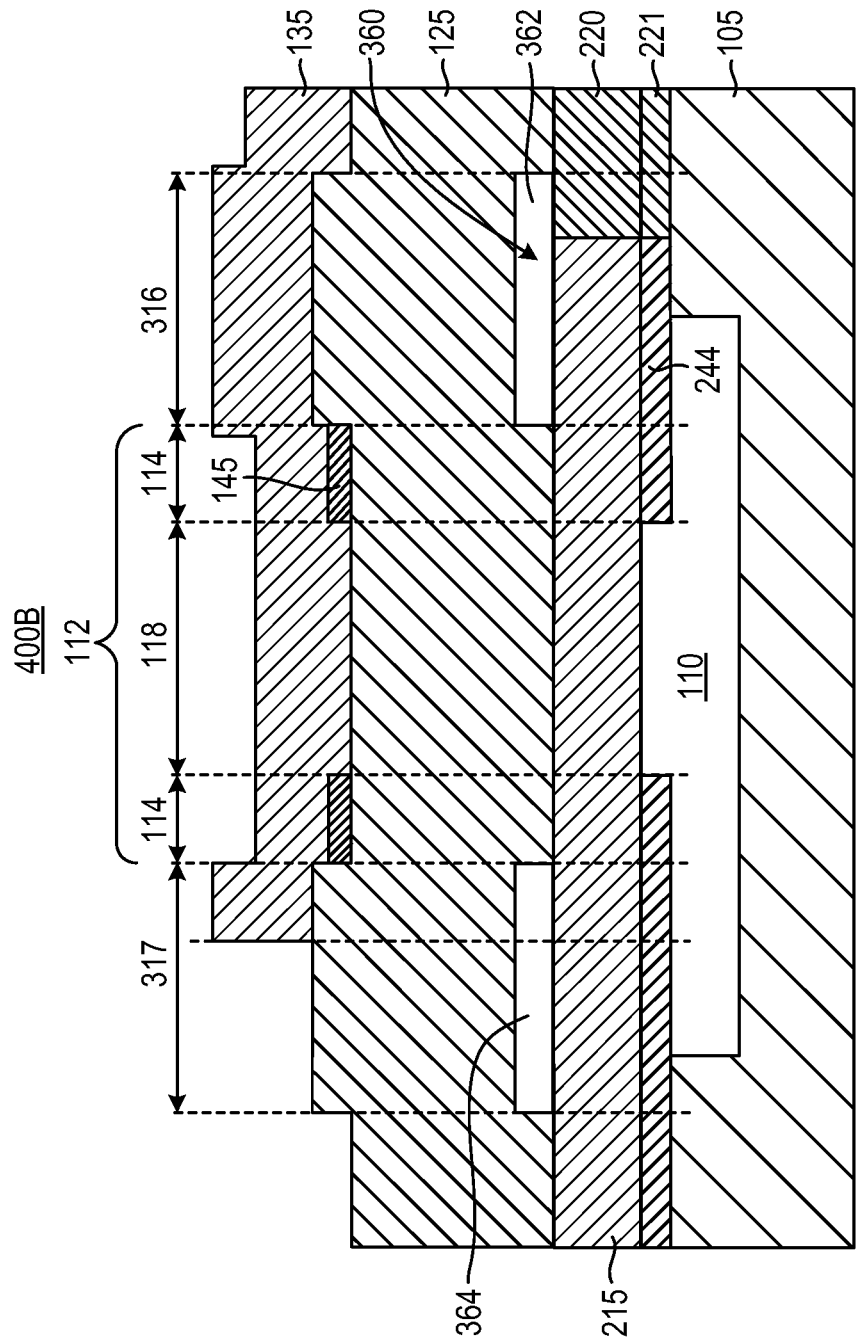
FIG. 4B is a cross-sectional view of an acoustic resonator according to a representative embodiment.

FIGS. 4A-4B are cross-sectional diagrams illustrating acoustic resonators having frames and an air-ring, according to representative embodiments.

Referring to FIG. 4A, acoustic resonator 400A is similar to acoustic resonator 300A, except for the location of the first frame. In particular, first frame 244 in the acoustic resonator 400A is formed between the substrate 105 and the bottom electrode 215, extending into portions of the cavity 110, as compared to the first frame 144 in the acoustic resonator 300A, which is formed between the bottom electrode 115 and the piezoelectric layer 125. In other words, the first frame 244 is formed below the bottom electrode 215. The first frame 244 provides benefits similar to the first frame 144 acoustic resonators 100B through 100F, although its performance and manufacture varies somewhat due to the different location.

The first frame 244 has an inner edge that defines a boundary of the active region 118 formed within the main membrane region 112. The outer edges of the first frame 144 may coincide with the outer edges of the bottom electrode 215. The frame region 114 is formed between the inner edge of the first frame 244 (which substantially coincides with the outer boundary of the active region 118) and an inner edge of the bottom air-ring 360 (which substantially coincides with the outer boundary of the main membrane region 112). The first frame 244 and the bottom electrode 215 may be formed of the same materials as discussed above with regard to the first frame 144 and the bottom electrode 115 in FIG. 1B, for example.

In the depicted embodiment, an additional planarization layer 221 is disposed on the substrate 105 adjacent to the first frame 244, providing a substantially planar upper surface on which the bottom electrode 215 and the planarization layer 220 are formed. That is, the bottom electrode 215 and the adjacent planarization layer 220 are disposed on the first frame 244 and the adjacent additional planarization layer 221. The bottom electrode 215 and the adjacent planarization layer 220 thus provide a substantially planar upper surface on which the piezoelectric layer 125 is formed. The planarization layer 220 and the additional planarization layer 221 may be formed of borosilicate glass (BSG), for example. The top electrode 135 is formed on the piezoelectric layer 125.

Referring to FIG. 4B, acoustic resonator 400B is similar to acoustic resonator 400A, except that the acoustic resonator 400B includes the second frame 145 in addition to the first frame 244. The second frame 145 is formed between the piezoelectric layer 125 and the top electrode 135, and the first frame 244 is formed between the substrate 105 and the bottom electrode 215, extending into portions of the cavity 110.

As discussed above, the second frame 145 is a composite frame formed in a bottom portion of the top electrode 135. In the depicted embodiment, the second frame 145 has an inner edge that is substantially aligned with the inner edge of the first frame 244. Therefore, the inner edge of the second frame 145 and the inner edge of the first frame 244 together define the outer boundary of the active region 118 formed within the main membrane region 112. An outer edge of the second frame 145, which is substantially aligned with an inner edge of the bottom air-ring 360, substantially coincides with the outer boundary of the main membrane region 112. However, as discussed above with reference to FIGS. 1E and 1F, the inner edge of one of the first frame 244 or the second frame 145 may extend further into the main membrane region 112. In this case, the inner edge of the one of the first frame 244 or the second frame 145 extending further into the main membrane region 112 defines the outer boundary of the active region 118.

Figure 5A:
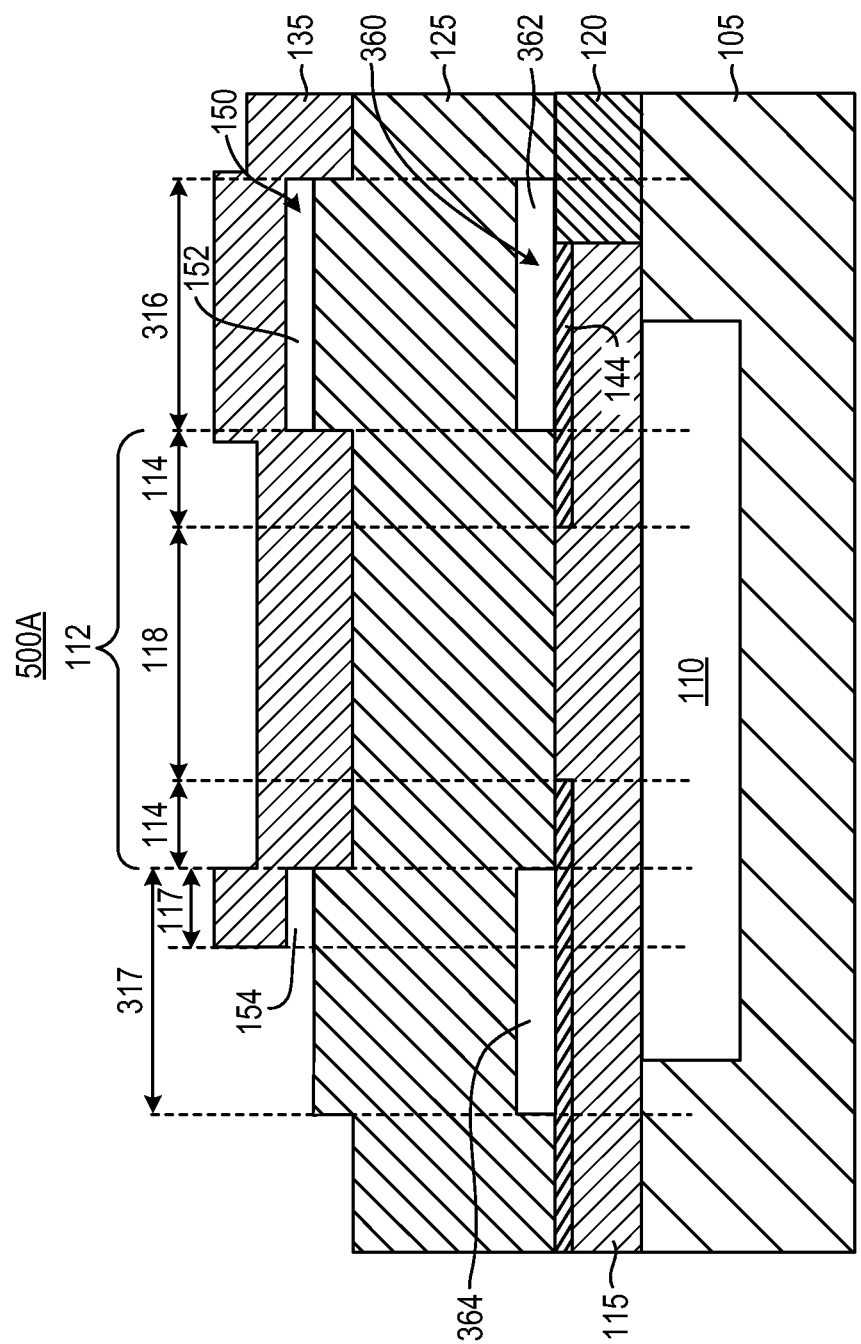
FIG. 5A is a cross-sectional view of an acoustic resonator according to a representative embodiment.
Figure 5B:
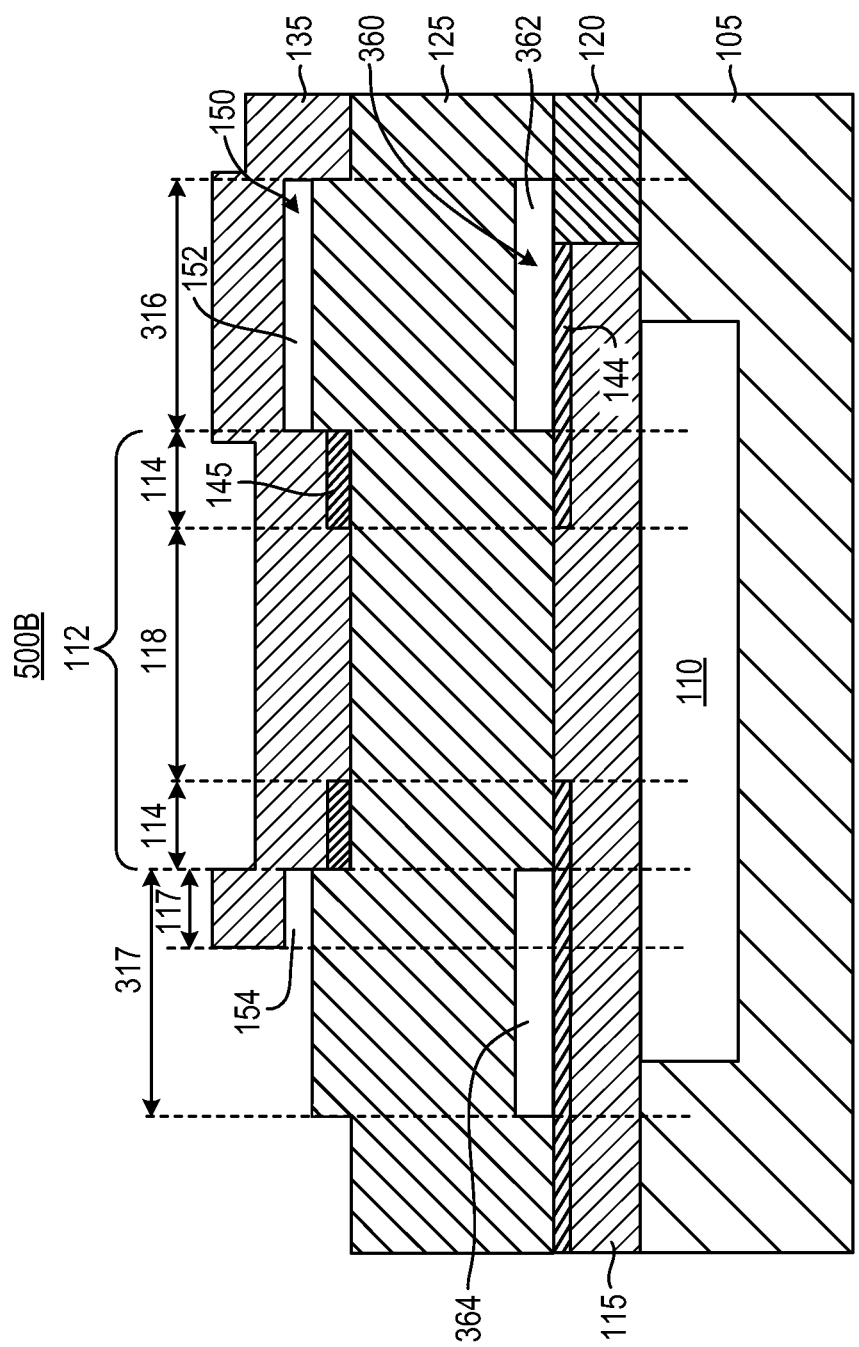
FIG. 5B is a cross-sectional view of an acoustic resonator according to a representative embodiment.

FIGS. 5A-5B are cross-sectional diagrams illustrating acoustic resonators having frames and multiple air-rings, according to representative embodiments.

Referring to FIG. 5A, acoustic resonator 500A is similar to acoustic resonators 100B and 300A in that it incorporates multiple air-rings, top air-ring 150 and bottom air-ring 360, combined with first frame 144 formed between the substrate 105 and the bottom electrode 115. Each of the top and bottom air-rings 150 and 360 extends along all or a portion of the perimeter of the acoustic resonator 500A. In the cross-sectional view, the top air-ring 150 includes air-bridge 152 and air-wing 154, and the bottom air-ring 360 includes air-bridges 362 and 364. The width of the wider of the air-bridge 152 or the air-bridge 362 defines air-bridge extension region 316 adjacent the main membrane region 112, although in the depicted embodiment, the air-bridges 152 and 362 are shown as having the same width, for purposes of illustration. The width of the air-wing 154 defines the air-wing region 117 and the width of the air-bridge 364 defines the air-bridge extension region 317, both of which are also adjacent the main membrane region 112. Dotted vertical lines indicate the boundaries of air-bridge extension regions 316 and 317 and air-wing region 117, respectively. The air-bridge regions 152 and 362 have respective inner edges that substantially define an outer boundary of the main membrane region 112 on one side (the top electrode 135 connecting edge), and the air-wing 154 and the air-bridge 364 have respective inner edges that substantially define an outer boundary on the other side of the main membrane region 112, as discussed above.

As mentioned above, the acoustic resonator 500A further comprises the first frame 144 disposed in a top portion of the bottom electrode 115. The inner edge of the first frame 144 defines the boundary of the active region 118 formed within the main membrane region 112. The outer edges of the first frame 144 may coincide with the outer edges of the bottom electrode 115. A frame region 114 is formed between the inner edge of the first frame 144 and the inner edge of at least one of the top air-ring 150 or the bottom air-ring 360, whichever extends furthest toward the main membrane region 112, as discussed above. Thus, the main membrane region 112 effectively consists of the active region 118 and the frame region 114. In the embodiment depicted in FIG. 5A, the first frame 144 is a composite frame formed within the bottom electrode 115, although, in alternative embodiments, the first frame 144 may be an add-on frame (144') formed on the top surface of the bottom electrode 115.

Referring to FIG. 5B, acoustic resonator 500B is similar to acoustic resonator 500A, except that the acoustic resonator 500B further includes the second frame 145 in addition to the first frame 144. The second frame 145 is formed between the piezoelectric layer 125 and the top electrode 135, and the first frame 144 is formed between the bottom electrode 115 and the piezoelectric layer 125. Otherwise, the acoustic resonator 500B includes the top air-ring 150, including the air-bridge 152 and the air-wing 154, and the bottom air-ring 360, including the air-bridges 362 and 364, that extend along all or a portion of the perimeter of the acoustic resonator 500B, as discussed above.

Also as discussed above, the second frame 145 is a composite frame formed in a bottom portion of the top electrode 135. In the depicted embodiment, the second frame 145 has an inner edge that is substantially aligned with the inner edge of the first frame 144. Therefore, the inner edge of the second frame 145 and the inner edge of the first frame 144 together define the outer boundary of the active region 118 formed within the main membrane region 112. Of course, in various embodiments, one or both of the composite first or second frames 144 or 145 may be replaced with add-on first or second frames 144' or 145' without departing from the scope of the present teachings.

Figure 6A:
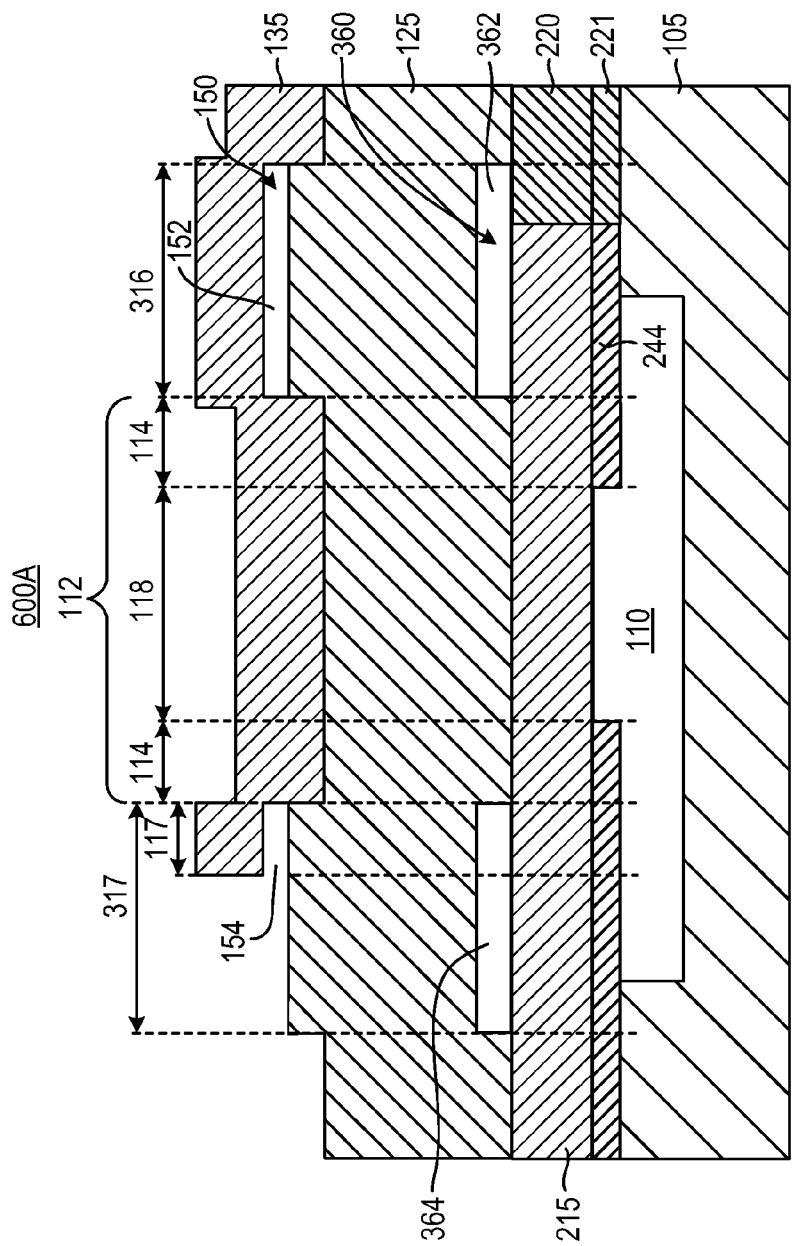
FIG. 6A is a cross-sectional view of an acoustic resonator according to a representative embodiment.
Figure 6B:
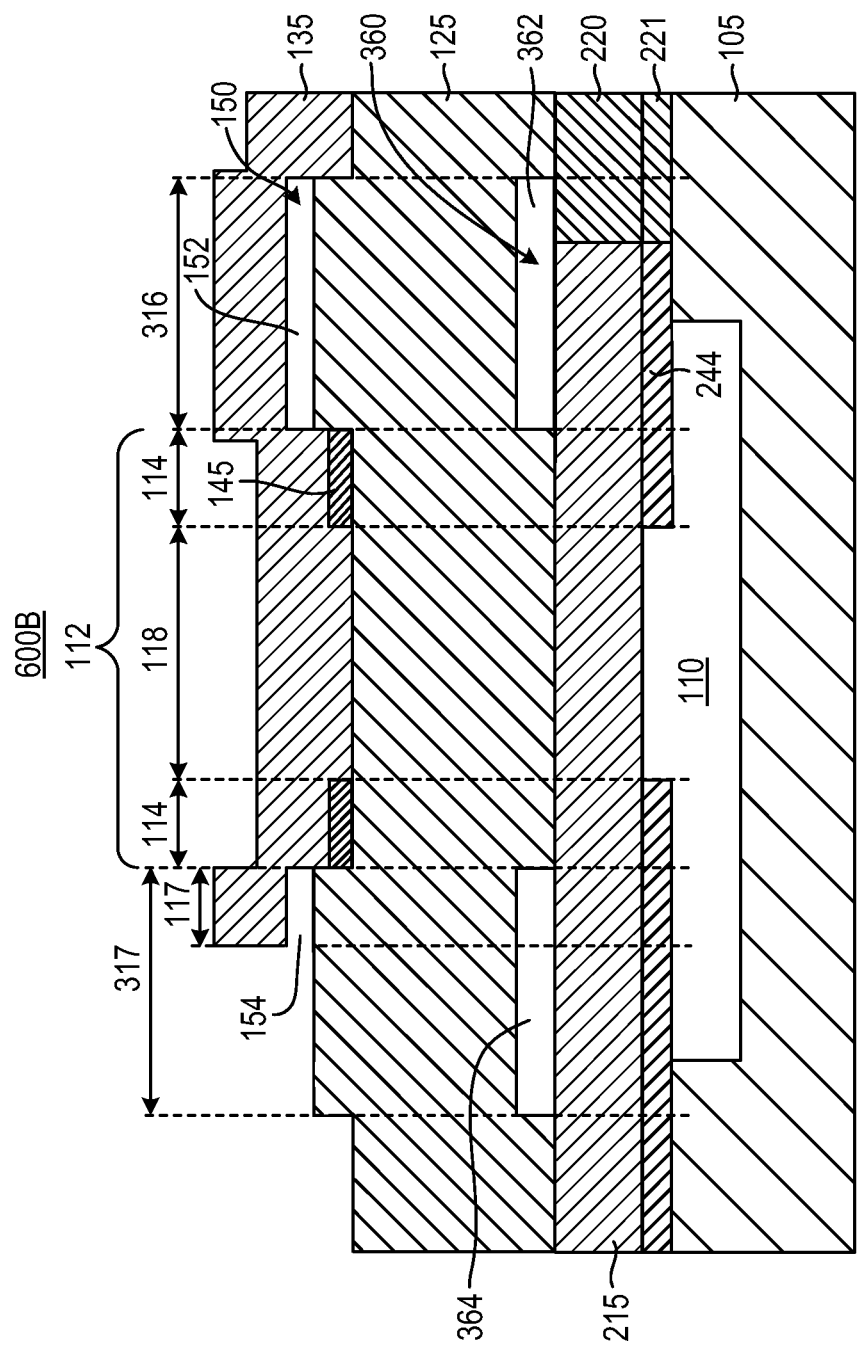
FIG. 6B is a cross-sectional view of an acoustic resonator according to a representative embodiment.

FIGS. 6A-6B are cross-sectional diagrams illustrating acoustic resonators having frames and multiple air-rings, according to representative embodiments.

Referring to FIG. 6A, acoustic resonator 600A is similar to acoustic resonators 200A and 400A in that it incorporates multiple air-rings, top air-ring 150 and bottom air-ring 360, combined with first frame 244 formed between the substrate 105 and the bottom electrode 215, and extending into portions of the cavity 110. Each of the top and bottom air-rings 150 and 360 extends along all or a portion of the perimeter of the acoustic resonator 600A. In the cross-sectional view, the top air-ring 150 includes air-bridge 152 and air-wing 154, and the bottom air-ring 360 includes air-bridges 362 and 364. The width of the wider of the air-bridge 152 or the air-bridge 362 defines air-bridge extension region 316 adjacent the main membrane region 112, although in the depicted embodiment, the air-bridges 152 and 362 are shown as having the same width for purposes of illustration. The width of the air-wing 154 defines the air-wing region 117 and the width of the air-bridge 364 defines the air-bridge extension region 317, both of which are also adjacent the main membrane region 112. Dotted vertical lines indicate the boundaries of air-bridge extension regions 316 and 317 and air-wing region 117, respectively.

The air-bridges 152 and 362 have respective inner edges that substantially define an outer boundary of the main membrane region 112 on one side (the connecting edge), and the air-wing 154 and the air-bridge 364 have respective inner edges that substantially define an outer boundary on the other side of the main membrane region 112. As a practical matter, the main membrane region 112 will not extend past the inner most edge of the air-bridges 152 and 362 on the top electrode 135 connecting side and will not extend past the inner most edge of the air-wing 154 and air-bridge 364 on the top electrode 135 non-connecting side.

The acoustic resonator 600A further comprises the first frame 244, which has an inner edge that defines a boundary of the active region 118 formed within the main membrane region 112. The outer edges of the first frame 244 may coincide with the outer edges of the bottom electrode 215. The frame region 114 is formed between the inner edge of the first frame 244 and the inner edge of at least one of the top air-ring 150 or the bottom air-ring 360, whichever extends furthest toward the main membrane region 112, as discussed above. Thus, the main membrane region 112 effectively consists of the active region 118 and the frame region 114.

Referring to FIG. 6B, acoustic resonator 600B is similar to acoustic resonator 600A, except that the acoustic resonator 600B further includes the second frame 145 in addition to the first frame 244. The second frame 145 is formed between the piezoelectric layer 125 and the top electrode 135, and the first frame 244 is formed between the substrate 105 and the bottom electrode 215. Otherwise, the acoustic resonator 600B includes the top air-ring 150, including the air-bridge 152 and the air-wing 154, and the bottom air-ring 360, including the air-bridges 362 and 364, that extend along all or a portion of the perimeter of the acoustic resonator 600B, as discussed above.

Also as discussed above, the second frame 145 is a composite frame formed in a bottom portion of the top electrode 135. In the depicted embodiment, the second frame 145 has an inner edge that is substantially aligned with the inner edge of the first frame 244. Therefore, the inner edge of the second frame 145 and the inner edge of the first frame 244 together define the outer boundary of the active region 118 formed within the main membrane region 112. Of course, in various embodiments, one or both of the composite second frames 145 may be replaced with an add-on frame 145' without departing from the scope of the present teachings.

Certain of the embodiments discussed above depict acoustic resonators having first and second frames. That is, each of the acoustic resonators 300B and 500B has a first frame 144 or 144' and a second frame 145 or 145', and each of the acoustic resonators 400B and 600B has a first frame 244 and a second frame 145 or 145'. For purposes of illustration, in each of these embodiments, the inner edges of the first frames (144, 144', 244) are substantially aligned with the inner edges of the second frames (145, 145'), respectively. However, as discussed above with reference to FIGS. 1E and 1F, it is understood that the inner edge of one of the first frame (144, 144', 244) or the second frame (145, 145') may extend further into the main membrane region 112. In this case, the inner edge of the one of the first frame (144, 144', 244) or the second frame (145, 145') extending further into the main membrane region 112 defines the outer boundary of the active region 118.

Figure 7A:
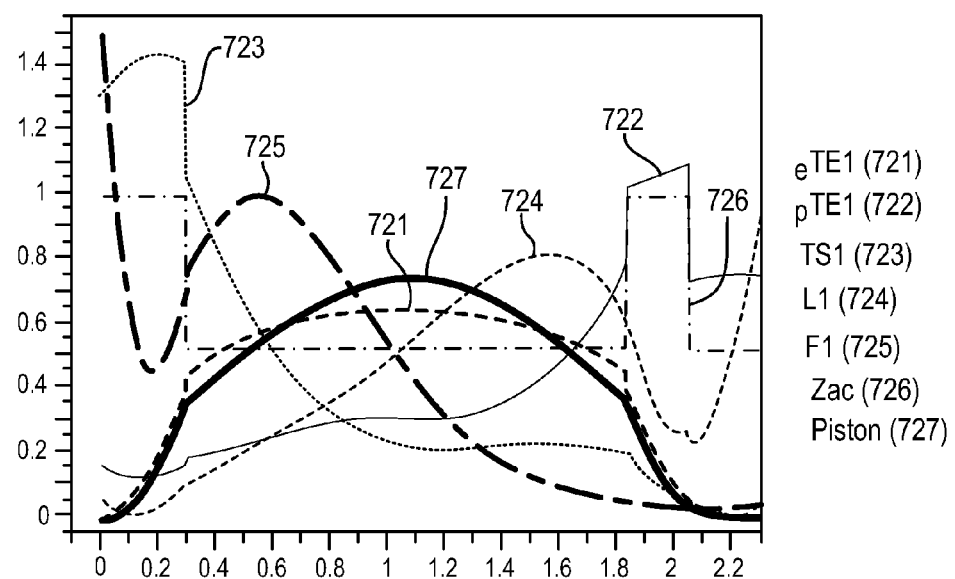
FIGS. 7A-7B are graphs depicting Normalized Peak Strain Energy (NPSE) distributions of the lowest-order modes for an FBAR stack and for a decoupling region stack, respectively, for comparison purposes.
Figure 7B:
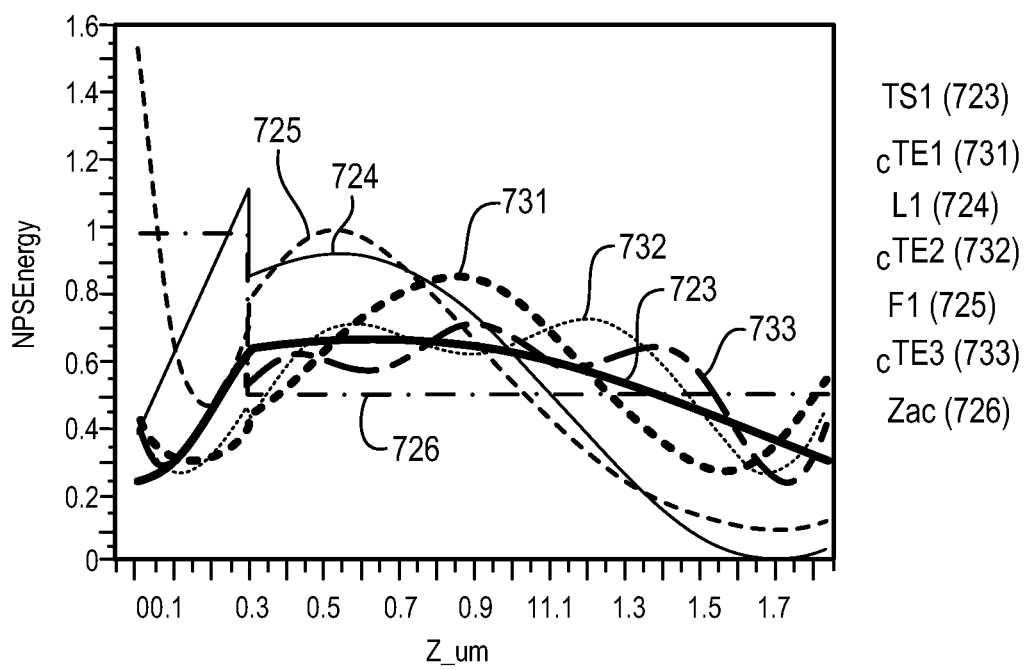

FIGS. 7A-7B are graphs depicting Normalized Peak Strain Energy (NPSE) distributions of the first five modes for an FBAR (e.g., acoustic resonator 100D) in the active region 118 and outside of the main membrane region 112 (e.g., in the decoupling region of air-bridge 152 of acoustic resonator 100D), respectively, shown here for purposes of illustration. FIG. 7A is a graph depicting NPSE distributions of the electrically driven piston mode (trace 727) and the first five modes (evanescent and propagating) supported by the active region 118 of the acoustic resonator 100D (traces 721-726), calculated at the parallel resonance frequency Fp. The acoustic stack in that region comprises the bottom electrode 115', the piezoelectric layer 125', the top electrode 135' and the passivation layer (not shown in FIG. 1D). These five lowest order modes include evanescent thickness extensional mode (eTE1) (trace 725), propagating thickness extensional mode (pTE1) (trace 722), thickness sheer mode (TS1) (trace 723), dilatational mode (L1) (trace 724), and flexural mode (F1) (trace 725).

Zac (trace 726) indicates acoustic impedance normalized to acoustic impedance of the Mo layer of the bottom electrode 115' (the highest in the acoustic stack), and is used in FIGS. 7A and 7B to mark positions in the acoustic stack.

For example, referring to the Zac trace 726 in FIG. 7A, it is apparent that the bottom electrode 115' (formed of Mo) extends from 0 to approximately 0.25 µm, the piezoelectric layer 125' (formed of AlN) extends from approximately 0.25 µm to approximately 1.85 µm, the top electrode 135' (formed of Mo) extends from approximately 1.85 µm to approximately 2.1 µm, and the passivation layer (formed of AlN) extends from approximately 2.1 µm to approximately 2.3 µm.

FIG. 7B is a graph depicting NPSE distributions of the first six modes (propagating and complex) supported by the region outside of the main membrane region 112 of the acoustic resonator 100D calculated at parallel resonance frequency Fp. The acoustic stack in that region comprises the bottom electrode 115' and the piezoelectric layer 125'. These six lowest order modes include thickness shear mode (TS1) (trace 722), dilatational mode (L1) (trace 721), flexural mode (F1) (trace 725), and the first three lowest order thickness-extensional complex modes (cTE1, cTE2 and cTE3) (traces 731, 732 and 733, respectively). Similarly to FIG. 7A, Zac (trace 726) indicates acoustic impedance normalized to acoustic impedance of the Mo layer of the bottom electrode 115' (the highest in the acoustic stack), and is used to mark positions in the acoustic stack. For example, referring to the Zac trace 726 in FIG. 7B, it is apparent that the bottom electrode 115' (formed of Mo) extends from 0 to approximately 0.25 µm and the piezoelectric layer 125' (formed of AlN) extends from approximately 0.25 µm to approximately 1.85 µm.

Referring to the active region 118 of the acoustic resonator 100D, it is shown in FIG. 7A that pTE1 mode (trace 722) and L1 mode (trace 724) are confined to the top of the acoustic stack, and that TS1 mode (trace 723) and F1 mode (trace 725) are confined to the bottom of the acoustic stack. Notably, eTE1 mode (trace 721) is confined to the center portion of the acoustic stack and rather closely resembles the piston mode (trace 727). However, the differences in vertical profiles and polarizations between the piston mode (purely longitudinal mode) and the eTE1 mode (predominantly longitudinal, but with some shear component) prevent complete cancellation of the piston mode at the edge of the top electrode 135' of the acoustic resonator 100D. In other words, at the structural discontinuities of acoustic resonator 100D (for example at the outside edge of the top electrode 135'), the eTE1 mode (trace 721) is predominantly excited to suppress the motion of electrically excited piston mode. However, because of above-mentioned differences in vertical profiles and polarizations between the piston and eTE1 modes, complete suppression of motion at the top electrode 135' edge is not possible, and other propagating and complex modes are excited in order to facilitate continuity of appropriate displacement and stress components at structural discontinuities (for example, at the top electrode 135' edge of the acoustic resonator 100D). Examples of these additional modes needed to facilitate continuity of appropriate displacement and stress components are shown as pTE1, TS1, L1 and F1 modes in FIG. 7A, and as TS1, L1, F1 and cTE1-cTE3 modes in FIG. 7B. In particular, excitation of the TS1, L1 and F1 modes shown in FIG. 7B leads to radiative energy loss from the main membrane region 112 of the acoustic resonator 100D to the substrate 105 and the subsequent reduction of parallel resistance Rp and quality factor Q.

In conventional acoustic resonators, frames, air-bridges and air-wings placed under the top electrode are used to suppress total motion at the top electrode edge. However, as shown in FIG. 7A, for example, these conventional features placed under the top electrode 135' will predominantly interact with pTE1 and L1 propagating modes that are predominantly confined to the top of the active region 118 of the acoustic resonator 100D, as well as in other acoustic resonators discussed herein. Thus, placement of additional frames in the bottom part of the acoustic stack allows for further suppression of TS1 and F1 modes, which are predominantly confined to the bottom part of the acoustic stack, and therefore beneficially provide better confinement of acoustic energy to the main membrane region 112 of the acoustic resonator 100D. Moreover, since outside of the main membrane region 112, the propagating eigen-modes TS1, L1 and F1 are predominantly confined to the bottom electrode 115' region of the acoustic stack, as illustrated in FIG. 7B, application of bottom air-rings (e.g., such as bottom air-ring 360 discussed with reference to FIGS. 3A-6B) allows for better acoustic decoupling of the main membrane region 112 from the peripheral regions of the acoustic resonators (e.g., acoustic resonators 100B-600B).

Figure 8:
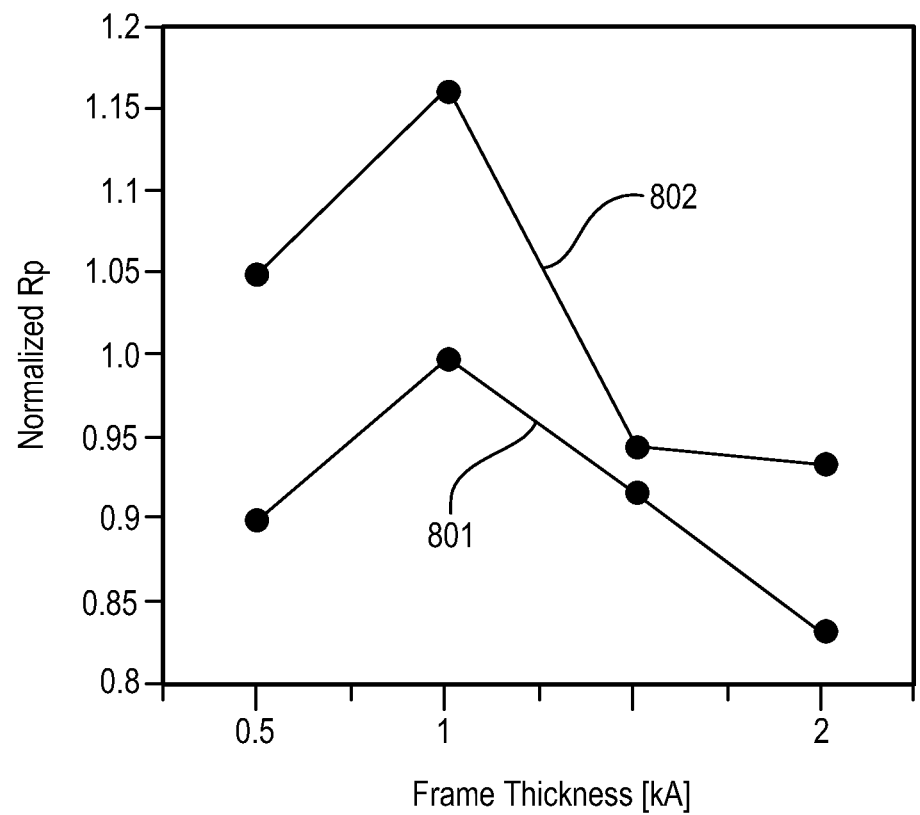
FIG. 8 is a graph comparing measured parallel resistance Rp values of a reference FBAR and an FBAR according to a representative embodiment.

FIG. 8 is a graph illustrating comparison of measured normalized parallel resistance Rp (arbitrary units) versus frame thickness (kÅ) for a reference FBAR (trace 801) and acoustic resonator 100D (trace 802) as shown in FIG. 1D. More specifically, the reference FBAR is the essentially the acoustic resonator 100D without the first frame 144'. The layer thicknesses in both the reference FBAR and the acoustic resonator 100D are the same. The bottom electrode 115' is formed of Mo having thickness of about 3 kÅ, the piezoelectric layer 125' is formed of AlN having thickness of about 15.5 kÅ, the top electrode 135' is formed of Mo having thickness of about 2.2 kÅ, and passivation layer (not shown in FIG. 1D) is formed of AlN having thickness of about 2 kÅ. The first frame 144' of the acoustic resonator 100D is formed of Mo having thickness of about 0.5 kÅ. The second frame 145', both in the reference FBAR and the acoustic resonator 100D, is formed of Mo with four different thicknesses of about 0.5 kÅ, 1 kÅ, 1.5 kÅ and 2 kÅ, as indicated by the horizontal axis in FIG. 8. For each of the reference FBAR and the acoustic resonator 100D and each of the second frame 145' thicknesses, the design corresponding to the highest parallel resistance Rp (in terms of the second frame 145' width and air-wing 154 width) has been selected, and subsequently, all measured parallel resistance Rp values have been divided by the parallel resistance Rp value corresponding to the reference FBAR with the second frame 145' thickness of about 1 kÅ.

Trace 801 indicates that for the reference FBAR, the second frame 145' thickness yielding the highest parallel resistance Rp is about 1 kÅ. Trace 802 indicates that adding the first frame 144' with the thickness of about 0.5 kÅ to the reference FBAR (and forming the acoustic resonator 100D) enables an increase of the parallel resistance Rp by approximately 17 percent when compared to the reference FBAR. This experimental evidence indicates that by suppressing TS1 and F1 eigen-modes (shown in FIG. 7A as traces 723 and 725, respectively) confined to the bottom of the main membrane region 112 of the acoustic resonator 100D allows to improve parallel resistance Rp and Q-factor as compared to the reference FBAR.

Generally, frames and air-wings can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonant frequency, series resistance Rs, parallel resistance Rp, or electromechanical coupling coefficient $Kt^2$.

Although the above description presents several embodiments in the form of FBAR devices, several of the described concepts could be implemented in other forms of acoustic resonators, such as SMRs, for example.

While example embodiments are disclosed herein, one of ordinary skill in the art appreciates that many variations that are in accordance with the present teachings are possible and remain within the scope of the appended claims. For instance, as indicated above, the location, dimensions, materials and even numbers of frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. An acoustic resonator device, comprising:
   a bottom electrode disposed on a substrate over an air cavity;
   a piezoelectric layer disposed on the bottom electrode;
   a top electrode disposed on the piezoelectric layer, an overlap between the top electrode, the piezoelectric layer and the bottom electrode over the air cavity including a main membrane region;
   at least one air-ring having an inside boundary defining an outside boundary of the main membrane region; and
   a first frame formed between the bottom electrode and the piezoelectric layer,
   wherein the at least one air-ring includes a bottom air-ring formed between the bottom electrode and the piezoelectric layer.

2. The acoustic resonator device of claim 1, wherein the first frame has an inner edge defining a boundary of an active region formed within the main membrane region.

3. The acoustic resonator device of claim 2, wherein the first frame comprises an add-on frame formed on a top surface of the bottom electrode.

4. The acoustic resonator device of claim 2, wherein the first frame comprises a composite frame formed within the bottom electrode.

5. The acoustic resonator device of claim 2, further comprising:
   a second frame formed between the piezoelectric layer and the top electrode, the second frame having an inner edge substantially aligned with the boundary of the active region formed within the main membrane region.

6. The acoustic resonator device of claim 2, further comprising:
   a second frame formed between the piezoelectric layer and the top electrode, wherein the inner edge of the first frame extends further into the main membrane region than an inner edge of the second frame.

7. The acoustic resonator device of claim 1, wherein the at least one air-ring further includes a top air-ring comprising an air-bridge and an air-wing formed between the piezoelectric layer and the top electrode.

8. The acoustic resonator device of claim 7, wherein at least one of the top air-ring and the bottom air-ring defining the outside boundary of the main membrane region.

9. The acoustic resonator device of claim 8, further comprising:
   a second frame formed between the piezoelectric layer and the top electrode.

10. The acoustic resonator device of claim 1, further comprising:
a second frame formed between the piezoelectric layer and the top electrode, wherein the second frame has an inner edge defining a boundary of an active region formed within the main membrane region, and
wherein the inner edge of the second frame extends further into the main membrane region than an inner edge of the first frame.

11. An acoustic resonator device, comprising:
a bottom electrode disposed on a substrate over an air cavity;
a piezoelectric layer disposed on the bottom electrode;
a top electrode disposed on the piezoelectric layer, an overlap between the top electrode, the piezoelectric layer and the bottom electrode over the air cavity including a main membrane region;
at least one air-ring having an inside boundary defining an outside boundary of the main membrane region; and
a first frame formed below the bottom electrode, between the substrate and the bottom electrode, and extending into a portion of the air cavity.

12. The acoustic resonator device of claim 11, wherein the first frame has an inner edge defining a boundary of an active region formed within the main membrane region.

13. The acoustic resonator device of claim 12, further comprising:
a second frame formed between the piezoelectric layer and the top electrode, the second frame having an inner edge substantially aligned with the boundary of the active region formed within the main membrane region.

14. The acoustic resonator device of claim 11, wherein the at least one air-ring includes a top air-ring comprising an air-bridge and an air-wing formed between the piezoelectric layer and the top electrode.

15. The acoustic resonator device of claim 14, wherein the at least one air-ring further includes a bottom air-ring formed between the bottom electrode and the piezoelectric layer, at least one of the top air-ring and the bottom air-ring defining the outside boundary of the main membrane region.

16. The acoustic resonator device of claim 15, further comprising:
a second frame formed between the piezoelectric layer and the top electrode.

17. The acoustic resonator device of claim 11, wherein the at least one air-ring includes a bottom air-ring formed between the bottom electrode and the piezoelectric layer.

18. The acoustic resonator device of claim 11, further comprising:
a second frame formed between the piezoelectric layer and the top electrode, wherein one of an inner edge of the first frame and an inner edge of the second frame that extends further into the main membrane region defines a boundary of an active region formed within the main membrane region.

19. An acoustic resonator device, comprising:
a bottom electrode disposed on a substrate over an air cavity;
a piezoelectric layer disposed on the bottom electrode and doped with at least one rare earth element;
a top electrode disposed on the piezoelectric layer, an overlap between the top electrode, the piezoelectric layer and the bottom electrode over the air cavity including a main membrane region;
an air-ring having an inside boundary defining a boundary of the main membrane region and located between the piezoelectric layer and the top electrode;
a first frame formed between the bottom electrode and the piezoelectric layer; and
a second frame formed between the piezoelectric layer and the top electrode,
wherein an active region is formed within the main membrane region, and a boundary of the active region is defined by at least one of an inner edge of the first frame and an inner edge of the second frame.

20. An acoustic resonator device, comprising:
a bottom electrode disposed on a substrate over an air cavity;
a piezoelectric layer disposed on the bottom electrode;
a top electrode disposed on the piezoelectric layer, an overlap between the top electrode, the piezoelectric layer and the bottom electrode over the air cavity including a main membrane region;
at least one air-ring having an inside boundary defining an outside boundary of the main membrane region;
a first frame formed between the bottom electrode and the piezoelectric layer; and
a second frame formed between the piezoelectric layer and the top electrode,
wherein one of a first inner edge of the first frame and a second inner edge of the second frame that extends further into the main membrane region defines a boundary of an active region formed within the main membrane region.

* * * * *